US010941505B1

(12) United States Patent
Snure et al.

(10) Patent No.: US 10,941,505 B1
(45) Date of Patent: Mar. 9, 2021

(54) GROWING TWO-DIMENSIONAL MATERIALS THROUGH HETEROGENEOUS PYROLYSIS

(71) Applicant: Government of the United States, as represented by the Secretary of the Air Force, Wright-Patterson AFB, OH (US)

(72) Inventors: Michael R. Snure, Dayton, OH (US); Gene P. Siegel, Beavercreek, OH (US); Catalin S. Badescu, Dublin, OH (US); Cristian Ciobanu, Golden, CO (US); Badri Narayanan, Clarendon Hills, IL (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 13 days.

(21) Appl. No.: 16/292,612

(22) Filed: Mar. 5, 2019

Related U.S. Application Data

(60) Provisional application No. 62/641,736, filed on Mar. 12, 2018.

(51) Int. Cl.
*C30B 25/02* (2006.01)
*C30B 25/10* (2006.01)
(Continued)

(52) U.S. Cl.
CPC ............... *C30B 25/10* (2013.01); *C30B 25/18* (2013.01); *C30B 29/38* (2013.01); *C30B 29/68* (2013.01);
(Continued)

(58) Field of Classification Search
CPC ......... C30B 25/00; C30B 25/02; C30B 25/10; C30B 25/16; C30B 25/18; C30B 29/00;
(Continued)

(56) References Cited

U.S. PATENT DOCUMENTS

| 5,188,757 A | 2/1993 | Paine, Jr. et al. |
| 8,790,775 B2 | 7/2014 | Kim et al. |

(Continued)

FOREIGN PATENT DOCUMENTS

| CN | 106868469 A | 6/2017 | |
| JP | 2015030648 A | 2/2015 | |
| WO | WO-2017029470 A1 * | 2/2017 | ....... C23C 16/45572 |

OTHER PUBLICATIONS

Snure, et al. publication entitled "Optical characterization of nanocrystalline boron nitride thin films grown by atomic layer deposition," Thin Solid Films, vol. 571, pp. 51-55 (2014). (Year: 2014).*

(Continued)

*Primary Examiner* — Kenneth A Bratland, Jr.
(74) *Attorney, Agent, or Firm* — AFMCLO/JAZ; Timothy Barlow

(57) ABSTRACT

A method of forming a $sp^2$ boron nitride (BN) layer on a surface of a substrate, the method comprising providing first and second precursors at the surface of the substrate, the first precursor being a source of boron and the second precursor being a source of nitrogen; heating the substrate to a temperature greater than a pyrolysis point for either of the first and second precursors; pyrolyzing the first precursor at the surface of the substrate; activating the second precursor at the surface of the substrate with the pyrolyzed first precursor; and adsorbing the pyrolyzed first precursor and the activated second precursor onto the surface of the substrate.

16 Claims, 32 Drawing Sheets

(51) Int. Cl.
*H01L 21/02* (2006.01)
*C30B 29/68* (2006.01)
*C30B 25/18* (2006.01)
*C30B 29/38* (2006.01)

(52) U.S. Cl.
CPC .. *H01L 21/02112* (2013.01); *H01L 21/02271* (2013.01)

(58) Field of Classification Search
CPC ......... C30B 29/10; C30B 29/38; C30B 29/68; H01L 21/02112; H01L 21/02271; C23C 16/02; C23C 16/0209; C23C 16/22; C23C 16/30; C23C 16/34; C23C 16/342; C23C 16/455; C23C 16/45514; C23C 16/45517
USPC ........ 117/84, 88–90, 94, 101, 105–106, 902, 117/937, 952
See application file for complete search history.

(56) References Cited

U.S. PATENT DOCUMENTS

| | | | |
|---|---|---|---|
| 9,328,413 B2 | 5/2016 | Tang et al. | |
| 9,562,287 B2 | 2/2017 | Kim et al. | |
| 9,859,034 B2 | 1/2018 | Sjong | |
| 2010/0218801 A1 | 9/2010 | Sung et al. | |
| 2011/0256386 A1 | 10/2011 | Shi et al. | |
| 2013/0078424 A1 | 3/2013 | Ding et al. | |
| 2013/0292685 A1 | 11/2013 | Jiang et al. | |
| 2014/0131626 A1 | 5/2014 | Lee et al. | |
| 2016/0079056 A1* | 3/2016 | Harada | C23C 16/36 438/778 |
| 2017/0239854 A1 | 8/2017 | Zhang et al. | |
| 2017/0268123 A1 | 9/2017 | Hwang | |
| 2018/0044185 A1 | 2/2018 | Sung et al. | |
| 2018/0308684 A1* | 10/2018 | Thomas | C01B 32/186 |

OTHER PUBLICATIONS

Y. Kobayashi, et al. publication entitled "Hexagonal boron nitride grown by MOVPE," Journal of Crystal Growth, vol. 310, pp. 5048-5052 (2008). (Year: 2008).*

Li, J., et al., "Hexagonal boron nitride epitaxial layers as neutron detector materials," Nuclear Instruments and Methods in Physics Research A 654 (2011), pp. 417-420.

Dahal, R., et al., "Epitaxially grown semiconducting hexagonal boron nitride as a deep ultraviolet photonic material," Applied Physics Letters, 98, (2011), pp. 211110-1 to 211110-3.

Ismach, A., et al., "Toward the Controlled Synthesis of Hexagonal Boron Nitride Films," ACS Nano, vol. 6, No. 7, 2012, pp. 6378-6385.

* cited by examiner

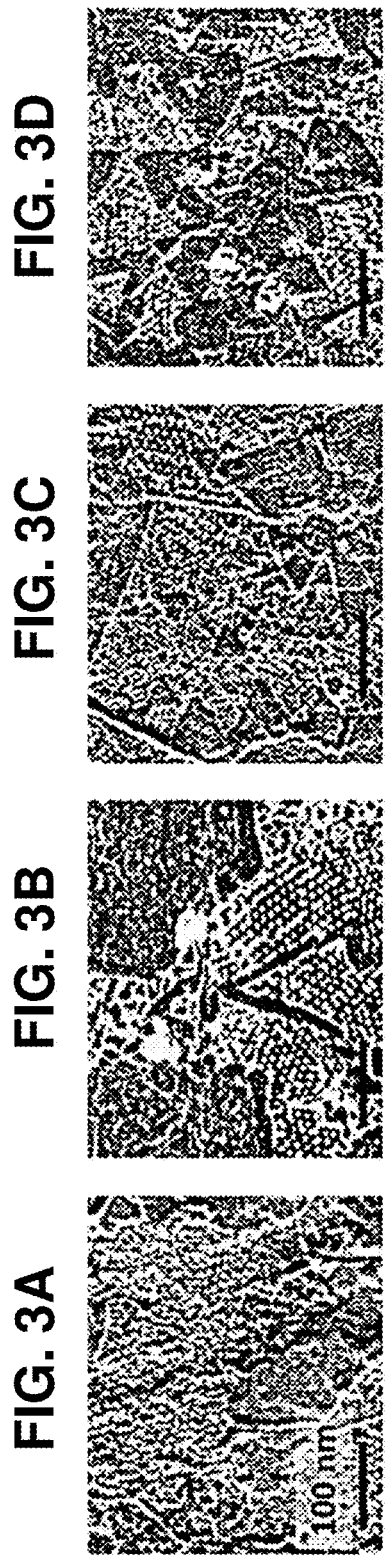

FIG. 13A
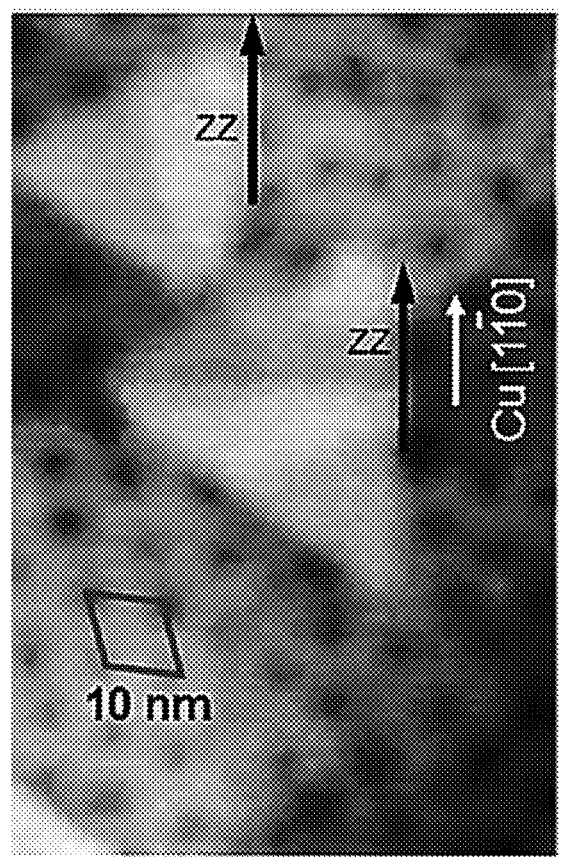
AFM scan direction
FIG. 13B
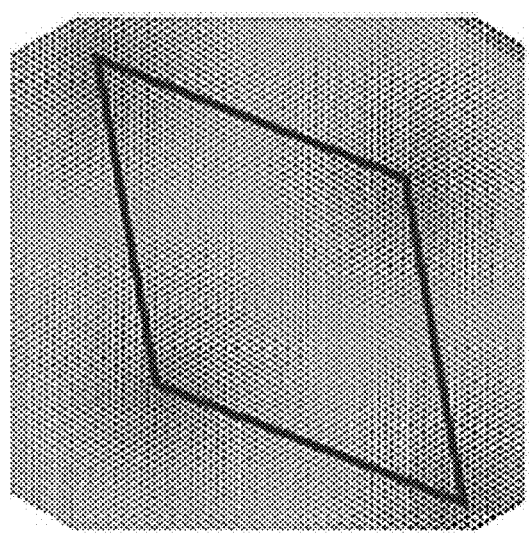

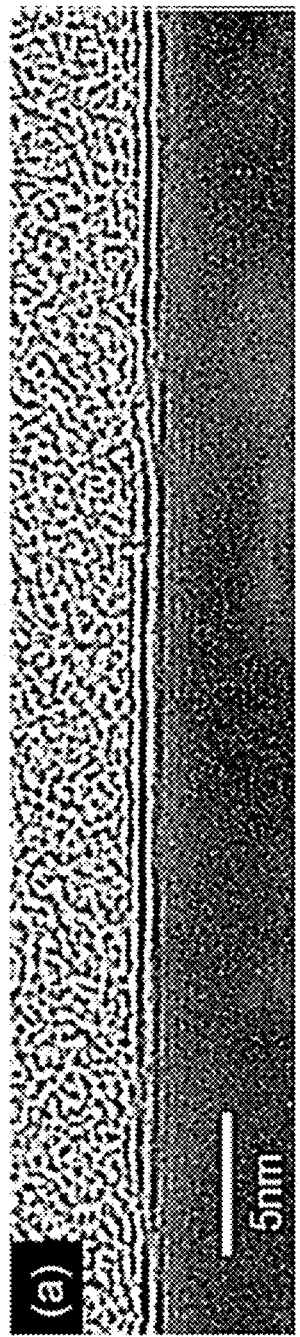 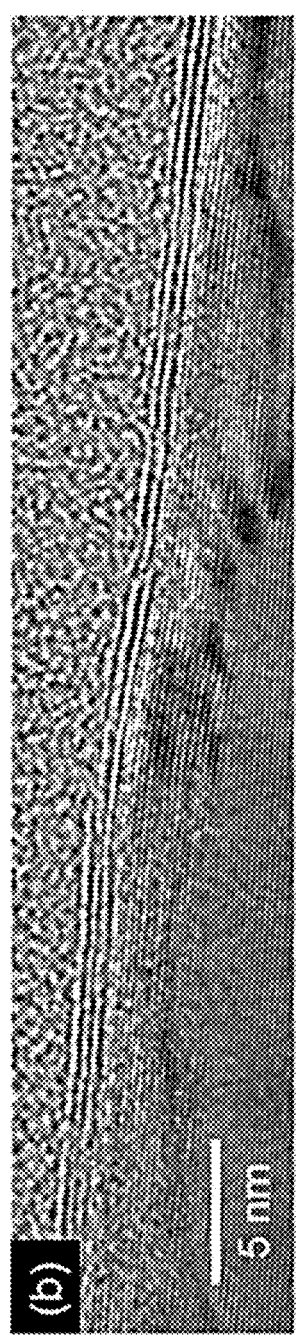

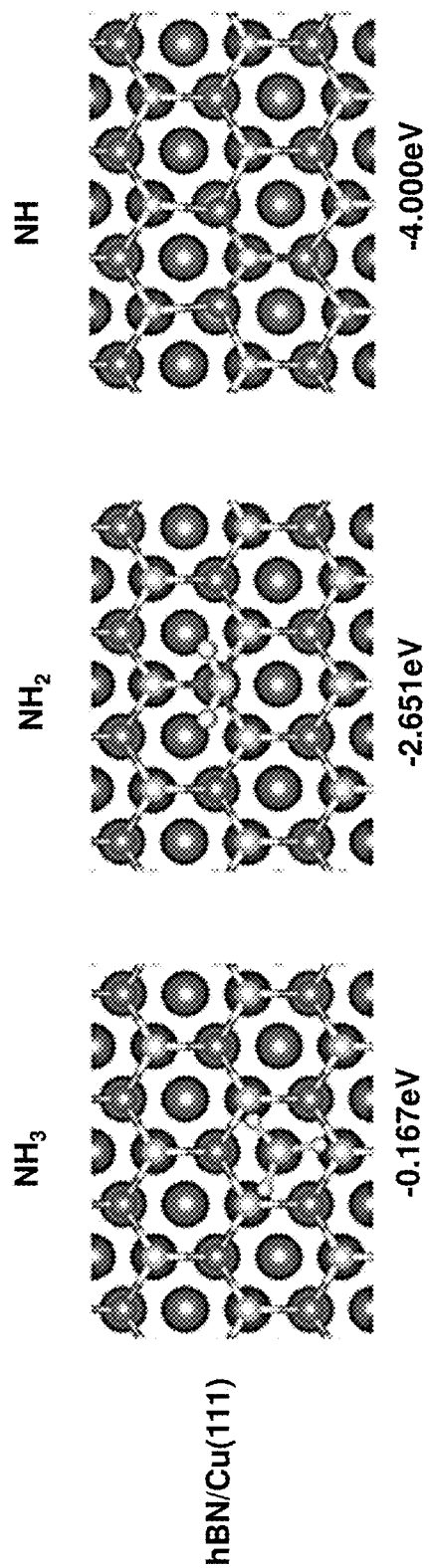
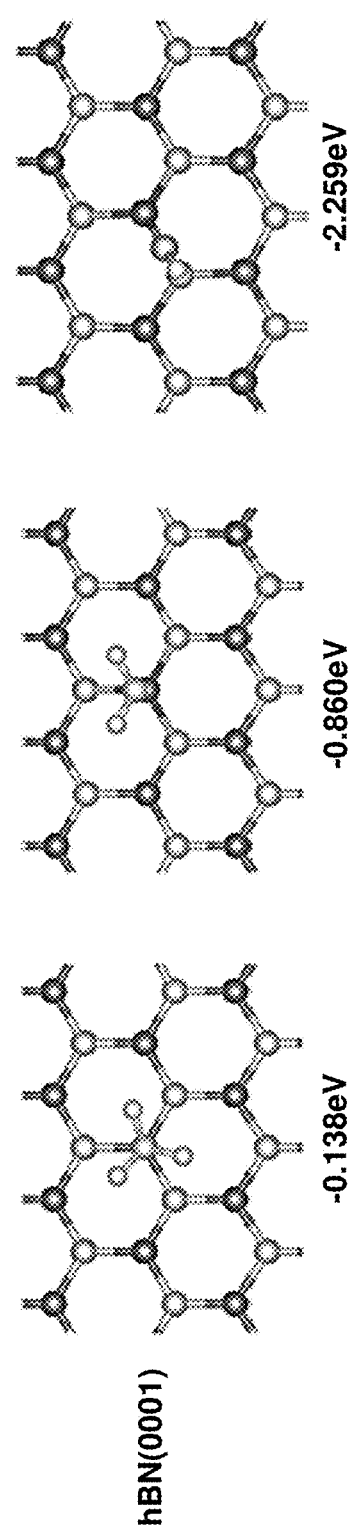
FIG. 18A
FIG. 18B

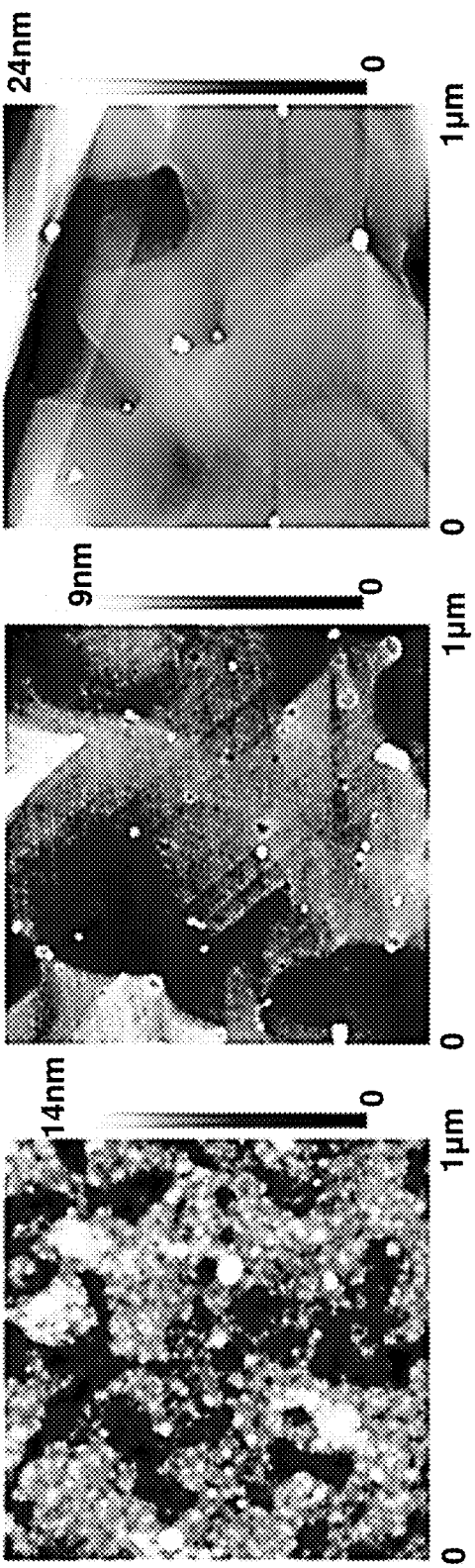
FIG. 20A As deposited Cu/sapphire
FIG. 20B $H_2$ annealed Cu/sapphire
FIG. 20C $NH_3$ annealed Cu/sapphire

GROWING TWO-DIMENSIONAL MATERIALS THROUGH HETEROGENEOUS PYROLYSIS

CROSS-REFERENCE TO RELATED APPLICATION(S)

This application claims the benefit of U.S. Provisional Patent Application No. 62/641,736 filed on Mar. 12, 2018, which is incorporated herein by reference in its entirety.

GOVERNMENT INTEREST

The invention described herein may be manufactured and used by or for the Government of the United States for all government purposes without the payment of any royalty.

BACKGROUND

Field of the Invention

The embodiments herein generally relate to material deposition methods and, more particularly, to chemical vapor deposition of $sp^2$ boron nitride layers.

Background of the Invention

Currently, $sp^2$ boron nitride (BN) including hexagonal (h), rhombohedral (r), and turbostratic (t) has emerged as an important two-dimensional ("2D") insulator for applications ranging from inert substrates for graphene-based nanoelectronic devices to tunneling barriers and atomically-thin capacitors. Progress in materials synthesis for these applications requires not only large area, high quality, and uniformity, but also precise and reproducible control over a number of BN layers and orientations. With few exceptions, BN is largely grown from single precursors (borazine or ammonia borane), which result in atomic monolayers on various metallic substrates. The morphology and alignment of these monolayers depends on the lattice mismatch and interactions between the $\pi$ states of $sp^2$ BN and the metal's d-shell electrons. Atomically flat BN monolayers may be grown on metals with filled or nearly filled d-shells and small lattice mismatch, like Cu ($d^{10}$) and Pt ($d^9$). On more strongly interacting metals with large mismatch (such as Ru), hexagonal boron nitride (hBN) forms a corrugated nanomesh.

Significant progress has also been made recently in synthesizing multilayer BN films with control over the number of layers, ranging from one to a few or more than ten layers. While procedures for controlling the layer thickness have been reported in these studies, a key fundamental question remaining is the extent of the nature of the growth mechanism. In the case of the growth from borazine on Fe or Fe alloy substrates, the mechanism relies on catalytic cracking of the precursor, adsorption into the substrate, precipitation to the surface, and formation of BN layers during cooling. There is clear evidence of this mechanism, which is, in fact, akin to growth of graphene on catalytic metal surfaces whereby new layers grow under previously deposited layers. The number of layers depends on the solubility of boron and nitrogen (or carbon, in the case of graphene) into the metal surface and cooling temperature and rate. However, on Cu, Ni, or Pt substrates, precipitation to the surface is not operational because growth proceeds at a given temperature and longer exposure (rather than cooling below a certain point) leads to the formation of new layers above the old ones, from one to a few and even tens of layers. What makes the question of the mechanism truly puzzling is that the catalytic action of the substrate diminishes sharply after deposition of one monolayer as the substrate is passivated by BN. This is consistent with many reports of surface-limited monolayer BN growth from borazine. A sort of catalytic transparency of the metal substrate (through the first BN layer) might be operational, but the catalytic action of the substrate effectively vanishes after one or two BN layers passivate it. The issue of the mechanism leading to multilayer BN growth was recognized and addressed by using diborane and ammonia as precursors. Surface-limited growth, precipitation from bulk (akin to graphene on Ni or Pd), and growth based on gas phase reactions were ruled out, but not conclusively settled on the mechanism responsible for the formation of multiple BN layers. Alternatively, thick epitaxial BN films can be grown by metal organic chemical vapor deposition ("MOCVD") on inert substrates using high growth temperatures (about 1500° C.). As a result, there remains a need for methods of consistently growing BN layers.

BRIEF SUMMARY OF THE INVENTION

In view of the foregoing, an embodiment herein provides a method of forming a $sp^2$ BN layer on a surface of a substrate, the method comprising providing first and second precursors at the surface of the substrate, the first precursor being a source of boron and the second precursor being a source of nitrogen; heating the substrate to a temperature greater than a pyrolysis point for either of the first and second precursors; pyrolyzing the first precursor at the surface of the substrate; activating the second precursor at the surface of the substrate with products of the pyrolyzed first precursor; and adsorbing the pyrolyzed first precursor and the activated second precursor onto the surface of the substrate.

The adsorbed first and second precursors may undergo dehydrogenation, polymerization, and then crystallization to form a first $sp^2$ BN layer over the substrate. The method may further comprise continued adsorbing the pyrolyzed first precursor and the activated second precursor onto the $sp^2$ BN layer to form a plurality of clusters of first and second precursors that undergo further dehydrogenation, polymerization, and crystallization to form an additional $sp^2$ BN layer over the $sp^2$ BN layer. The crystalline structures of the second $sp^2$ BN layer may be aligned with crystalline structures of the first $sp^2$ BN layer. The first $sp^2$ BN layer may comprise a moiré superstructure. The substrate may comprise any of copper, nickel, iridium, platinum, gold, sapphire, and silicon carbide. The substrate may have a temperature of less than approximately 1000° C. The ratio of the second precursor to the first precursor may range from 450 to 4800. The method may further comprise isolatedly introducing the first and second precursors on the surface of the substrate such that the first and second precursors do not interact with each other until at the surface of the substrate. The substrate may be electrically inactive. The substrate may comprise any of an insulator and a semiconductor.

Another embodiment provides a method comprising applying at least a first and second precursor compound simultaneously on a substrate; heating the substrate to a temperature greater than a pyrolysis point for either of the first and second precursor compounds; pyrolyzing the first precursor compound; activating the second precursor compound; and epitaxially growing a plurality of insulator layers from the pyrolyzed first precursor compound and the activated second precursor compound.

The first precursor compound may comprise a boron-based material, wherein the second precursor compound comprises a nitrogen-based material, and wherein the plurality of insulator layers comprises $sp^2$ BN layers. The method may further comprise adsorbing the pyrolyzed first precursor compound and the activated second precursor compound onto a surface of the substrate prior to epitaxially growing the plurality of insulator layers. The plurality of insulator layers may be grown by dehydrogenation, polymerization, and crystallization of an initial adsorbed pyrolyzed first precursor compound and activated second precursor compound followed by dehydrogenation, polymerization, and crystallization of a subsequent adsorbed pyrolyzed first precursor compound and activated second precursor compound until a predetermined number of insulator layers are epitaxially grown. The growth rates of the plurality of insulator layers may be different from one another, and the plurality of insulator layers may be epitaxially aligned with one another.

Another embodiment provides a method comprising applying a boron-based precursor compound and nitrogen-based precursor compound independently on a metallic substrate; heating the substrate to at least a threshold temperature causing the boron-based precursor compound to pyrolyze thereby causing the nitrogen-based precursor compound to activate; and growing a plurality of $sp^2$ BN layers from the pyrolyzed boron-based precursor compound and the activated nitrogen-based precursor compound. The method may further comprise passivating the metallic substrate with at least one $sp^2$ BN monolayer. The method may further comprise preventing boron atoms from dissolving into the metallic substrate during pyrolysis of the boron-based precursor compound; and preventing nitrogen atoms from dissolving into the metallic substrate during activation of the nitrogen-based precursor compound. The method may further comprise growing the plurality of $sp^2$ BN layers through a layer-by-layer process by repeating the applying and heating processes upon completion of each $sp^2$ BN layer.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIGS. 3A through 3D are atomic force microscopy (AFM) images taken at 1 min, 7.5 min, 15 min, and 30 min, respectively.

FIG. 13A is a height-contrast AFM images showing a close-up of the monolayer hBN moiré pattern and two second-layer islands that illustrate epitaxial relationship for the hBN layers on Cu(111). Atomic structure of the 10 nm periodic moiré formed when the hBN zigzag (zz) direction is rotated by 0=1° with respect to Cu[1$\bar{1}$0].

FIG. 13B is an enlargement of the parallelogram of FIG. 13A.

FIGS. 15A and 15B are transmission electron microscopy (TEM) images of two and three layers of hBN on Cu(111), respectively.

FIGS. 18A and 18B are top views of the most favorable adsorption positions for $NH_3$ and its radicals on hBN/Cu and hBN(0001), respectively. hBN(0001) was used in order to efficiently model a fully passivated hBN/hBN/ . . . /Cu substrate. The adsorption energies are given under each panel and are negative to indicate that adsorption is thermodynamically favorable, i.e., exothermic.

FIGS. 20A through 20C are height-contrast AFM from the Cu-on-sapphire substrates with FIG. 20A being as-deposited, 20B being after annealing at 850° C. in $H_2$ for 30 min, and FIG. 20C being after annealing in $NH_3$ for 15 min. The measured RMS roughness for the as deposited, $H_2$ annealed, and $NH_3$ annealed Cu/sapphire was 1.9 nm, 0.34 nm, and 0.6 nm, respectively.

Figure 1A:
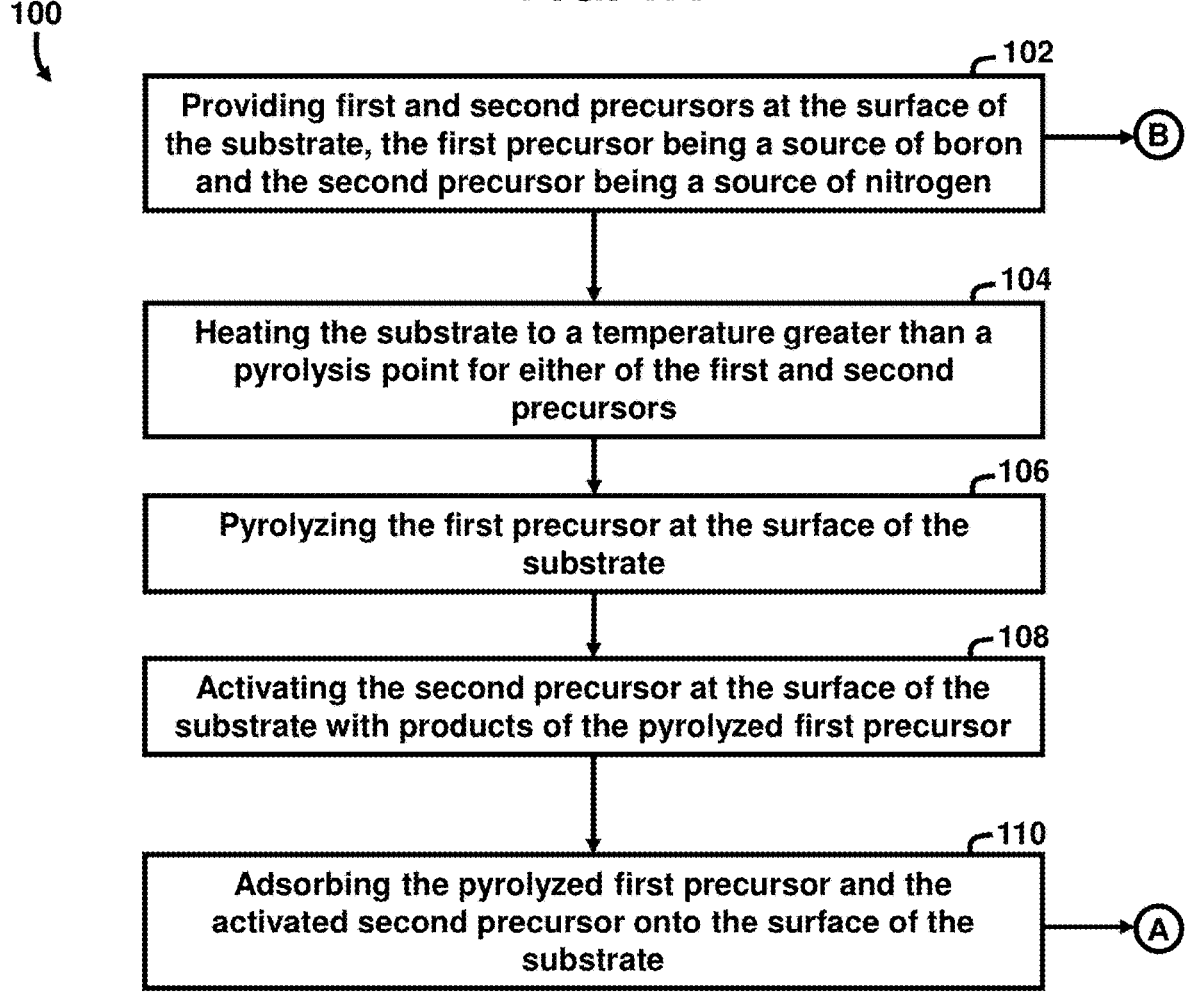
FIGS. 1A through 1C are flow diagrams illustrating a method of forming a $sp^2$ BN layer on a surface of a substrate.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

In the drawings, the size and relative sizes of layers and regions may be exaggerated for clarity. The present invention overcomes the foregoing problems and other shortcomings, drawbacks, and challenges of consistently growing $sp^2$ BN layers. Referring now to the drawings, and more particularly to FIGS. 1A through 20C where similar reference characters denote corresponding features consistently throughout, there are shown exemplary embodiments.

Referring now to the figures, methods of growing mono-, bi-, and trilayer hBN films on Cu(111), at temperatures lower than 1000° C. from triethylborane ("TEB") and ammonia as separate sources of B and N atoms are described according to embodiments herein. While some of the examples described herein refer to hBN layers or films, these are merely illustrative examples, and the embodiments herein are not restricted to hBN layers, but rather may also apply to $sp^2$ BN layers, films, and materials. On the basis of density functional theory ("DFT") calculations and characterization data, a mechanism for growth of multiple layers is proposed and includes activation of ammonia by boron and boron-containing radicals on the hBN covered surface. To ensure that these radicals are present on the surface, whether the surface it is already covered by hBN or not, the substrate temperature should be sufficiently high (for example, 900° C., but less than 1000° C.) so as to enable the pyrolysis of the TEB molecules on contact. This proposed mechanism, referred to herein as "heterogeneous pyrolysis," is markedly different from the formation of the first hBN layer, that is, surface adsorption followed by substrate-catalyzed dehydrogenation, polymerization of the B—N radicals, and crystallization.

Although there are significant differences in the growth rates of the first layer and subsequent layers, the hBN layers are well aligned with each other, as well as with the Cu substrate. This is important for future devices in which such alignment is expected to lead to high-quality interfaces and low-dissipation electronic transport. Multiple characterization tools, such as atomic force microscopy ("AFM"), transmission electron microscopy ("TEM"), Raman spectroscopy, and X-ray photoelectron spectroscopy ("XPS") may be employed to reveal the structure and morphology of the films. DFT calculations have shown that a modulated dipole layer forms at the interface between hBN and Cu, which interacts electrostatically with the AFM tip and leads to force modulations and hence to moiré patterns in height-contrast AFM images.

Figure 2A:
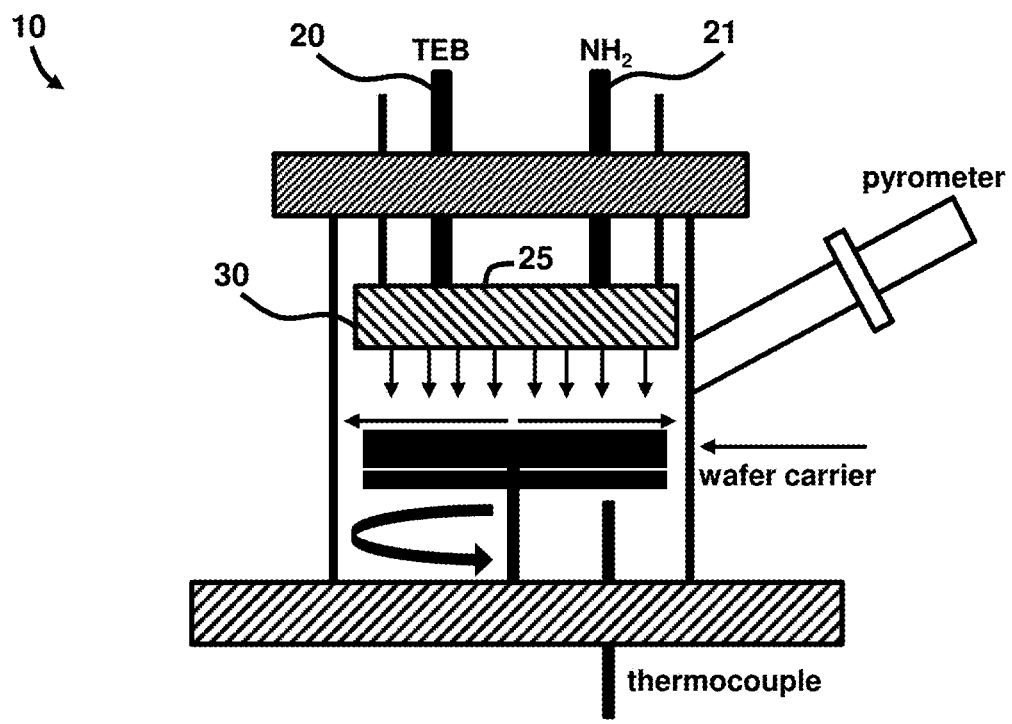
FIG. 2A is a schematic of a low-pressure MOCVD reactor with an actively cooled close coupled showerhead for forming $sp^2$ BN layers.
Figure 2B:
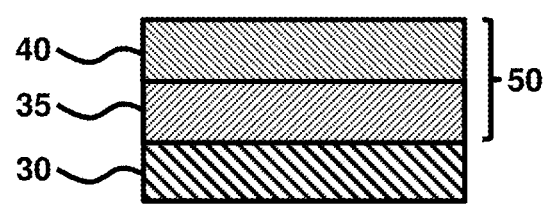
FIG. 2B is a schematic diagram illustrating growth of $sp^2$ BN layers on a substrate.

FIG. 1A, with reference to FIGS. 2A and 2B, is a flow diagram illustrating a method 100 of forming a $sp^2$ BN layer 35 on a surface 25 of a substrate 30, the method 100 comprising providing (102) first and second precursors 20, 21 at the surface 25 of the substrate 30, the first precursor 20 being a source of boron and the second precursor 21 being a source of nitrogen; heating (104) the substrate 30 to a temperature greater than a pyrolysis point for either of the first and second precursors 20, 21; pyrolyzing (106) the first precursor 20 at the surface 25 of the substrate 30; activating (108) the second precursor 21 at the surface 25 of the substrate 30 with products of the pyrolyzed first precursor 20; and adsorbing (110) the pyrolyzed first precursor 20 and the activated second precursor 21 onto the surface 25 of the substrate 30.

With the two-precursor system, one precursor (e.g., the first precursor 20, for example) pyrolyzes at a low temperature and one precursor (e.g., the second precursor 21) that pyolyzes at a high temperature. In this type of process, the growth is limited by the second precursor 21 at the high temperature. To overcome the pyrolysis bottleneck, the radicals from the first precursor 21 (formed by the pyrolysis process) is used to bond to the second precursor 21, thereby increasing adsorption and promoting pyrolysis.

This process can be extended to systems other that BN like $MoS_2$, $MoSe_2$, $WS_2$, etc. where a low temperature precursor for the metal would react with radicals at the surface 25 of the substrate 30 and promote the pyrolysis of a high temperature precursor such as $H_2S$, $H_2Se$.

Figure 1B:
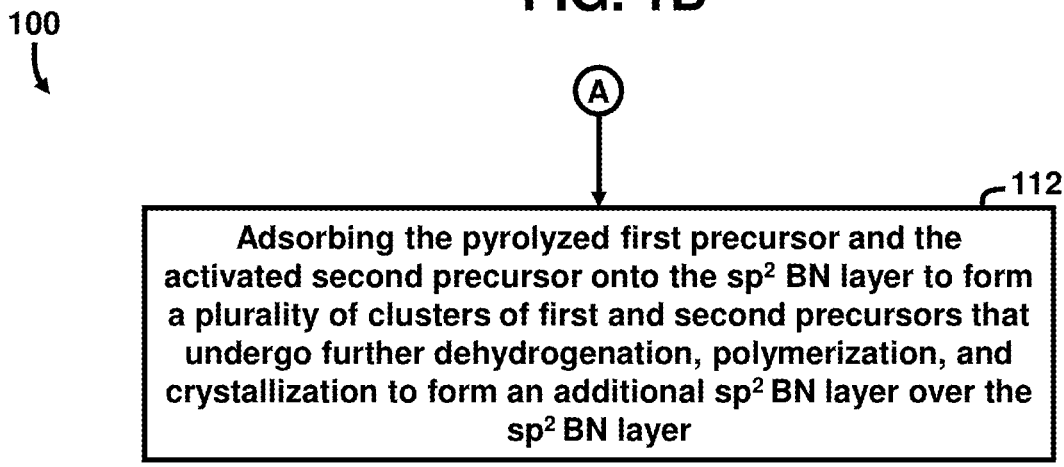

The adsorbed first and second precursors 20, 21 may undergo dehydrogenation, polymerization, and then crystallization to form a first $sp^2$ BN layer 35 over the substrate 30. As shown in FIG. 1B, the method 100 may further comprise continued adsorbing (112) the pyrolyzed first precursor 20 and the activated second precursor 21 onto the sp² BN layer 35 to form a plurality of clusters of first and second precursors 20, 21 that undergo further dehydrogenation, polymerization, and crystallization to form an additional sp² BN layer 40 over the sp² BN layer 35.

When growing two-dimensional BN on a metal substrate, growth is initially catalyzed by the metal, but when the metal is covered by the first layer of BN the surface can no longer catalyze the growth. This typically causes the growth to stop after the first layer. However, in accordance with the embodiments herein, the growth can be continued because the low temperature precursor for radicals act as both a source of B and a surface catalyst to permit continued growth.

Figure 1C:
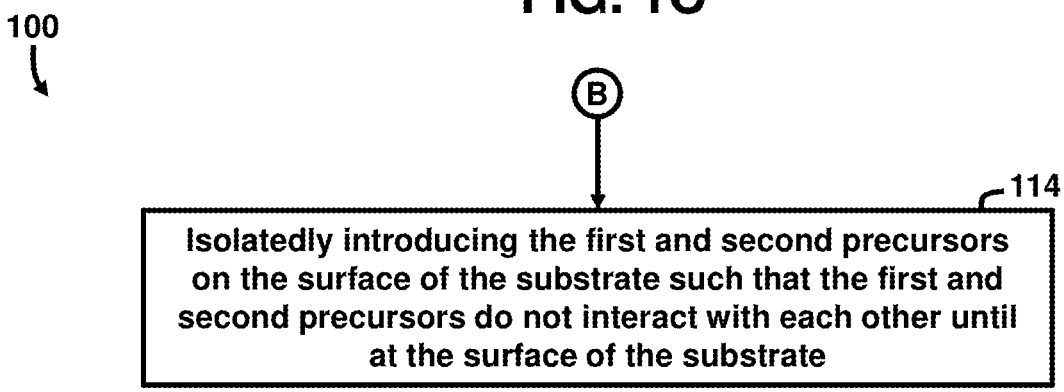

The crystalline structures of the second sp² BN layer 40 may be aligned with crystalline structures of the first sp² BN layer 35. In one example, the first sp² BN layer 35 may comprise a moiré superstructure, which depends on the type of substrate and the alignment of the BN to the substrate. The substrate 30 may comprise any of copper, nickel, iridium, platinum, gold, sapphire, and silicon carbide. The substrate 30 may have a temperature of less than approximately 1000° C., in one example. In another example, when the substrate 30 comprises sapphire, the temperature may be greater than 1000° C. The ratio of the second precursor 21 to the first precursor 20 may range from 450 to 4800. As shown in FIG. 1C, the method 100 may further comprise isolatedly introducing (114) the first and second precursors 20, 21 on the surface 25 of the substrate 30 such that the first and second precursors 20, 21 do not interact with each other until at the surface 25 of the substrate 30. The substrate 30 may be electrically inactive, in an example. Moreover, the substrate 30 may comprise any of an insulator and a semiconductor, in other examples.

Figure 1D:
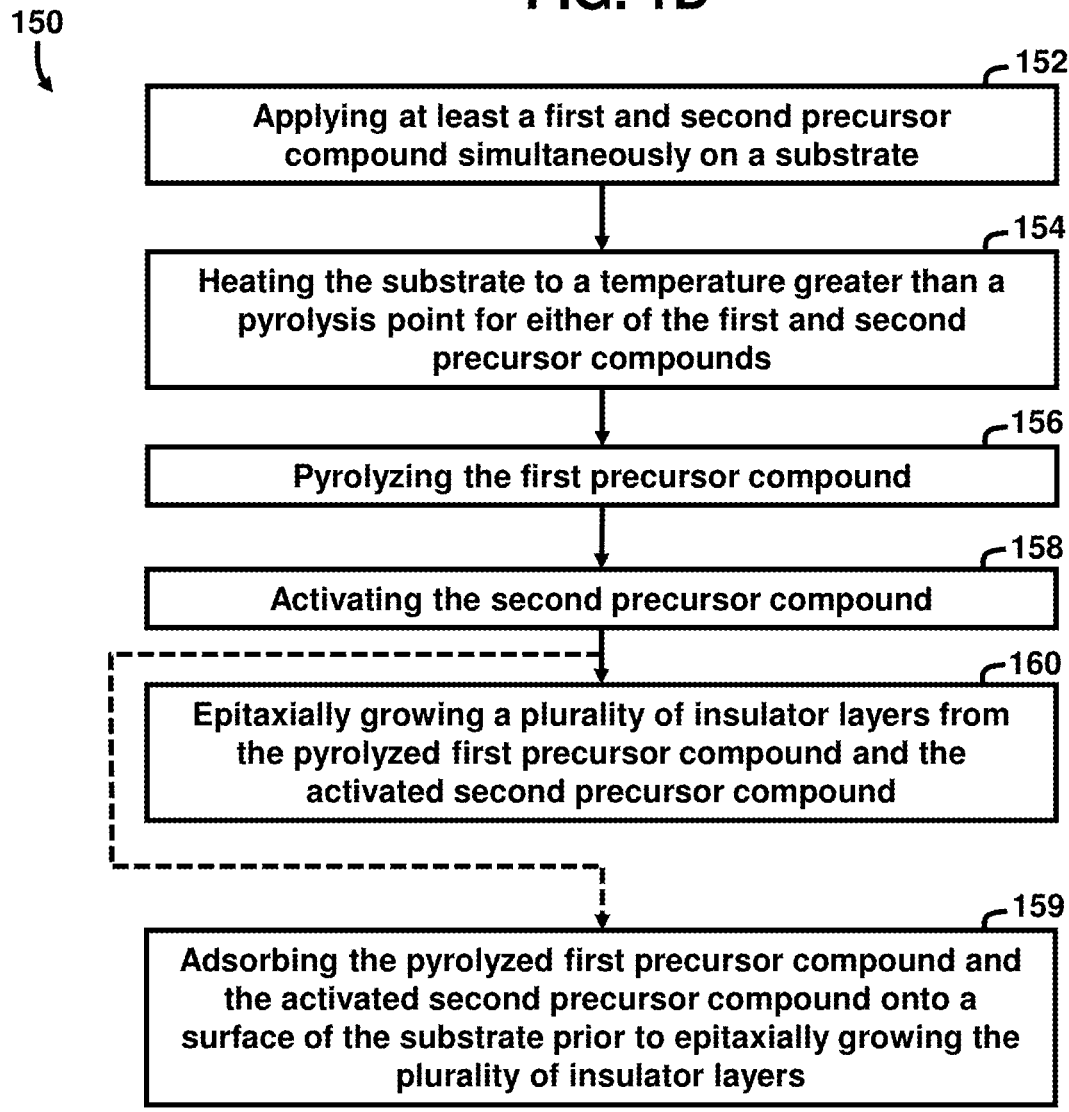
FIG. 1D is a flow diagram illustrating a method of epitaxially growing insulator layers.

FIG. 1D, with reference to FIGS. 2A and 2B, is a flow diagram illustrating a method 150 comprising applying (152) at least a first and second precursor compound (e.g., first and second precursors 20, 21) simultaneously on a substrate 30; heating (154) the substrate 30 to a temperature greater than a pyrolysis point for either of the first and second precursor compounds (e.g., first and second precursors 20, 21); pyrolyzing (156) the first precursor compound (e.g., first precursor 20); activating (158) the second precursor compound (e.g., second precursor 21); and epitaxially growing (160) a plurality of insulator layers 50 from the pyrolyzed first precursor compound (e.g., first precursor 20) and the activated second precursor compound (e.g., second precursor 21).

The first precursor compound (e.g., first precursor 20) may comprise a boron-based material, and the second precursor compound (e.g., second precursor 21) comprises a nitrogen-based material. The plurality of insulator layers 50 may comprise sp² BN layers 35, 40. The method 150 may further comprise adsorbing (159) the pyrolyzed first precursor compound (e.g., first precursor 20) and the activated second precursor compound (e.g., second precursor 21) onto a surface 25 of the substrate 30 prior to epitaxially growing the plurality of insulator layers 50. The plurality of insulator layers 50 may be grown by dehydrogenation, polymerization, and crystallization of an initial adsorbed pyrolyzed first precursor compound (e.g., first precursor 20) and activated second precursor compound (e.g., second precursor 21) followed by dehydrogenation, polymerization, and crystallization of a subsequent adsorbed pyrolyzed first precursor compound (e.g., first precursor 20) and activated second precursor compound (e.g., second precursor 21) until a predetermined number of insulator layers 50 are epitaxially grown. The growth rates of the plurality of insulator layers 50 may be different from one another, and the plurality of insulator layers 50 may be epitaxially aligned with one another.

Figure 1E:
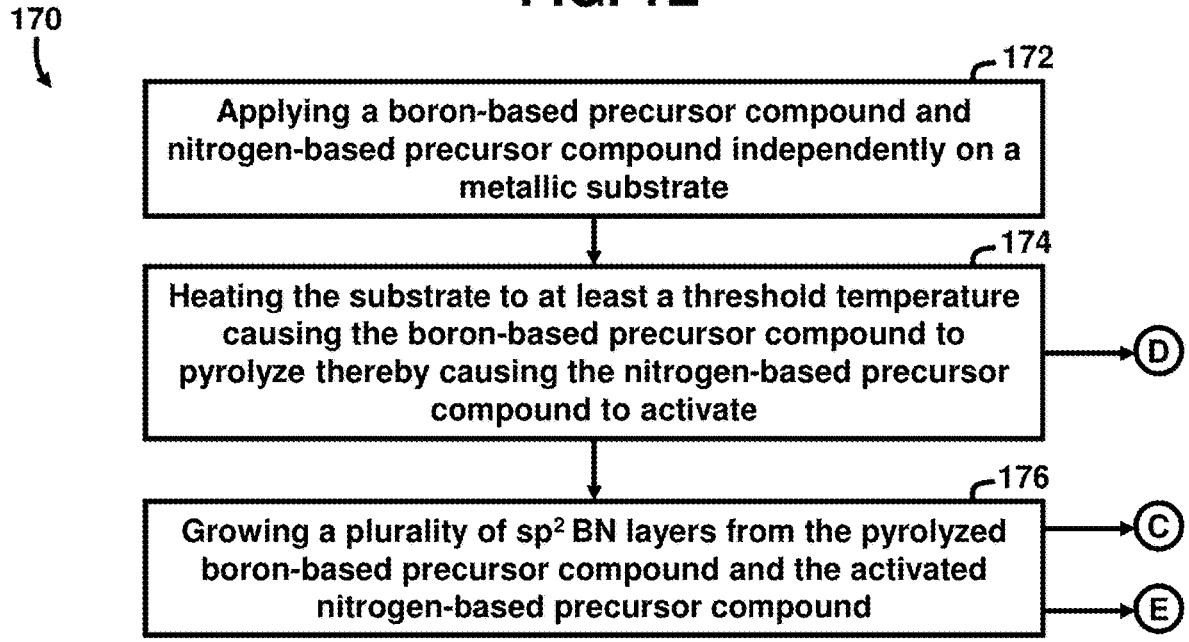
FIGS. 1E through 1H are flow diagrams illustrating a method of growing $sp^2$ BN layers.
Figure 1F:
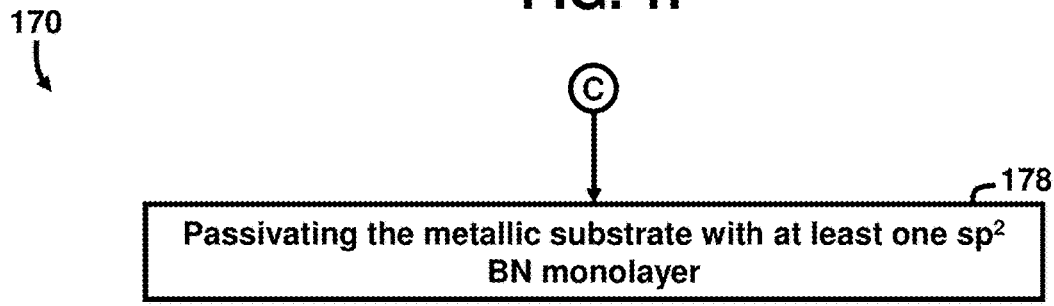
Figure 1G:
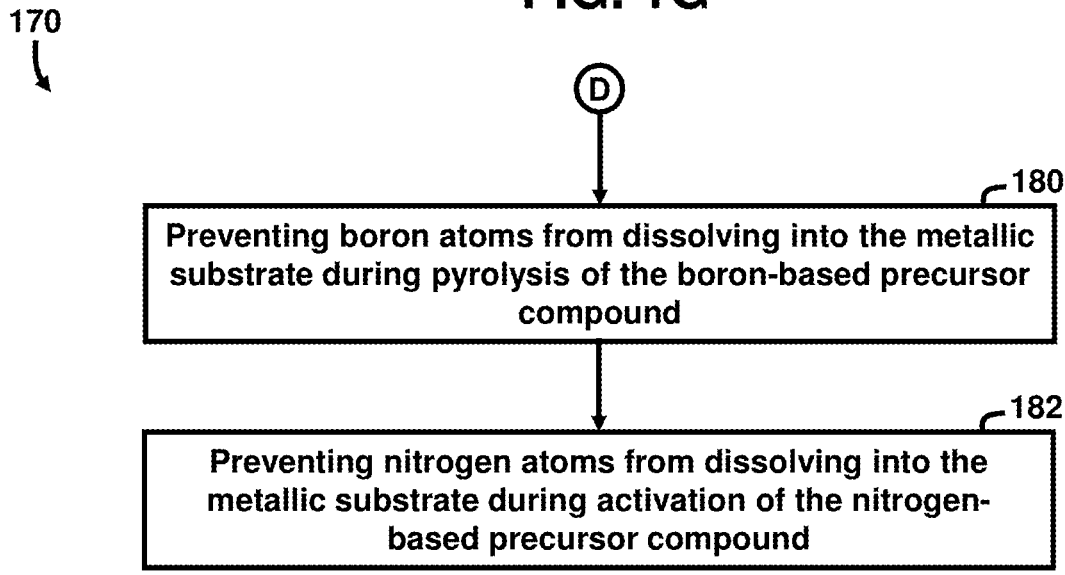
Figure 1H:
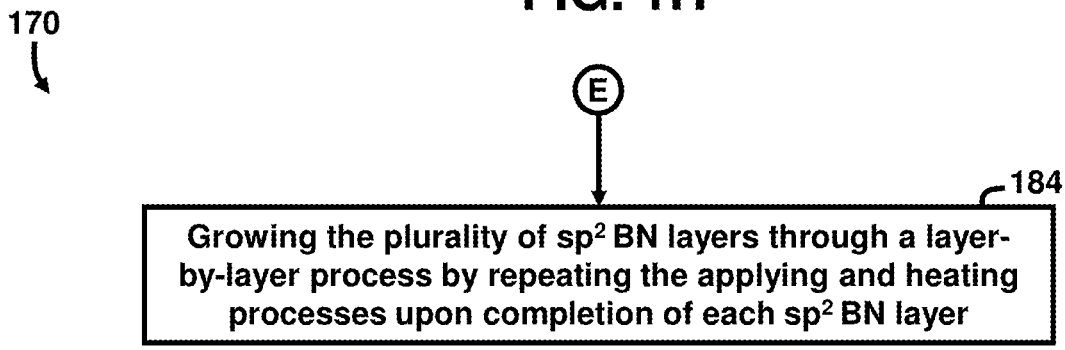

FIG. 1E, with reference to FIGS. 2A and 2B, is a flow diagram illustrating a method 170 comprising applying (172) a boron-based precursor compound (e.g., first precursor 20) and nitrogen-based precursor compound (e.g., second precursor 21) independently on a metallic substrate 30; heating (174) the substrate 30 to at least a threshold temperature causing the boron-based precursor compound (e.g., first precursor 20) to pyrolyze thereby causing the nitrogen-based precursor compound (e.g., second precursor 21) to activate; and growing (176) a plurality of sp² BN layers from the pyrolyzed boron-based precursor compound (e.g., first precursor 20) and the activated nitrogen-based precursor compound (e.g., second precursor 21). As shown in FIG. 1F, the method 170 may further comprise passivating (178) the metallic substrate 30 with at least one sp² BN monolayer 35. As shown in FIG. 1G, the method 170 may further comprise preventing (180) boron atoms from dissolving into the metallic substrate 30 during pyrolysis of the boron-based precursor compound (e.g., first precursor 20); and preventing (182) nitrogen atoms from dissolving into the metallic substrate 30 during activation of the nitrogen-based precursor compound (e.g., second precursor 21). As shown in FIG. 1H, the method 170 may further comprise growing (184) the plurality of sp² BN layers 35, 40 through a layer-by-layer process by repeating the applying and heating processes upon completion of each sp² BN layer 35, 40. Although FIG. 2B illustrates only two sp² BN layers 35, 40, the embodiments herein are not restricted to any particular number of sp² BN layers 35, 40 that form the plurality of insulator layers 50.

For multilayer growth, heterogeneous pyrolysis may not be specific to copper but may operate on a wide range of substrates 30, even inactive ones such as sapphire. Two conditions are utilized for heterogeneous pyrolysis to produce multilayer sp² BN layers 35, 40: (a) the precursors 20, 21 and the temperature of the substrate 30 are chosen such that one precursor (e.g., first precursor 20 or second precursor 21) pyrolizes and activates the other precursor (e.g., second precursor 21 or first precursor 20) on the surface 25 and (b) neither B nor N atoms dissolve into the substrate 30 during neither pyrolysis nor activation. While the first condition reduces to practical knowledge of precursors 20, 21, the latter is satisfied if the metallic substrate 30 is passivated with one sp² BN monolayer 35. As such, new growth methods for applications in which control over the number of layers and their alignment are crucial (tunneling barriers, ultrathin capacitors, and graphene-based devices) are achieved.

Experimentally, using Cu(111) thin films on sapphire substrates, hBN samples may be grown by low-pressure MOCVD from TEB and NH₃. FIG. 2A illustrates one embodiment of a cold wall MOCVD reactor with a close-coupled showerhead system 10 that may be employed for III-Nitride MOCVD growth. For this reactor configuration, the TEB and NH₃ precursors (e.g., first and second precursors 20, 21) are kept isolated at temperatures below their respective pyrolysis points, until their injection just above the heated substrate 30 (for example, 900° C., or less than 1000° C.). Under these conditions, TEB and NH₃ reach the surface 25 of the substrate 30 with little interaction, which is unique and quite different from the conventional solutions reported on CVD growth of BN from a single B—N precursor in a hot wall reactor. The use of separate B and N precursors (e.g., first and second precursors 20, 21) enables a range of input N/B ratios. However, due to variations in thermal diffusion, adsorption/desorption rates, sticking coefficients, and precursor decomposition rates, the actual concentration of active B and N species at the surface 25 of the substrate 30 may be significantly different than the nominal (input) N/B ratio, which may be in the range of 1000-1125. Because $NH_3$ has a pyrolysis temperature greater than 900° C., it remains largely intact at the surface 25 of the substrate 30, which results in a significant drop in the activated N/B ratio. As such, the availability and stability of adsorbed $NH_x$ (x=1, 2, 3) species on the surface 25 of the substrate 30 is dependent on the hBN growth process.

Figure 3E:
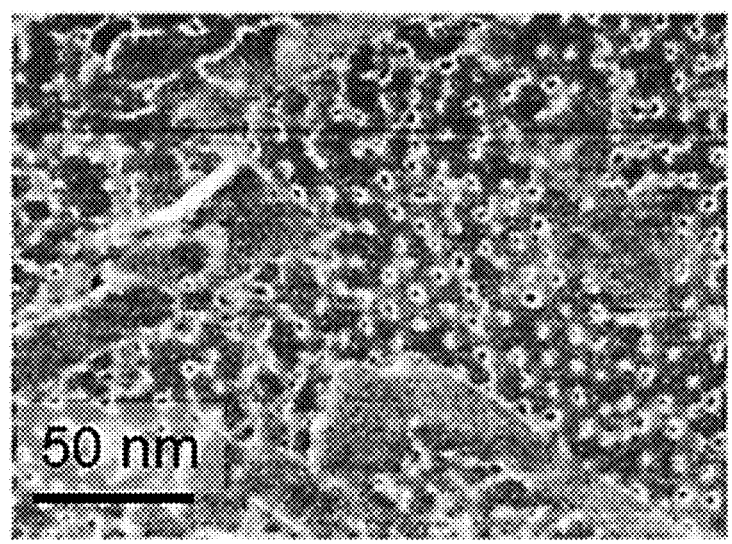
FIGS. 3E and 3F are typical AFM images showing phase contrast and height contrast, respectively.
Figure 3F:
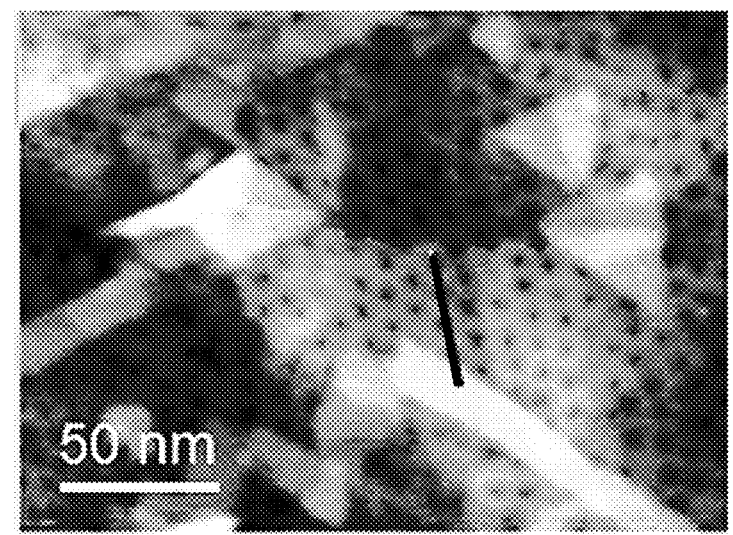
Figure 4:
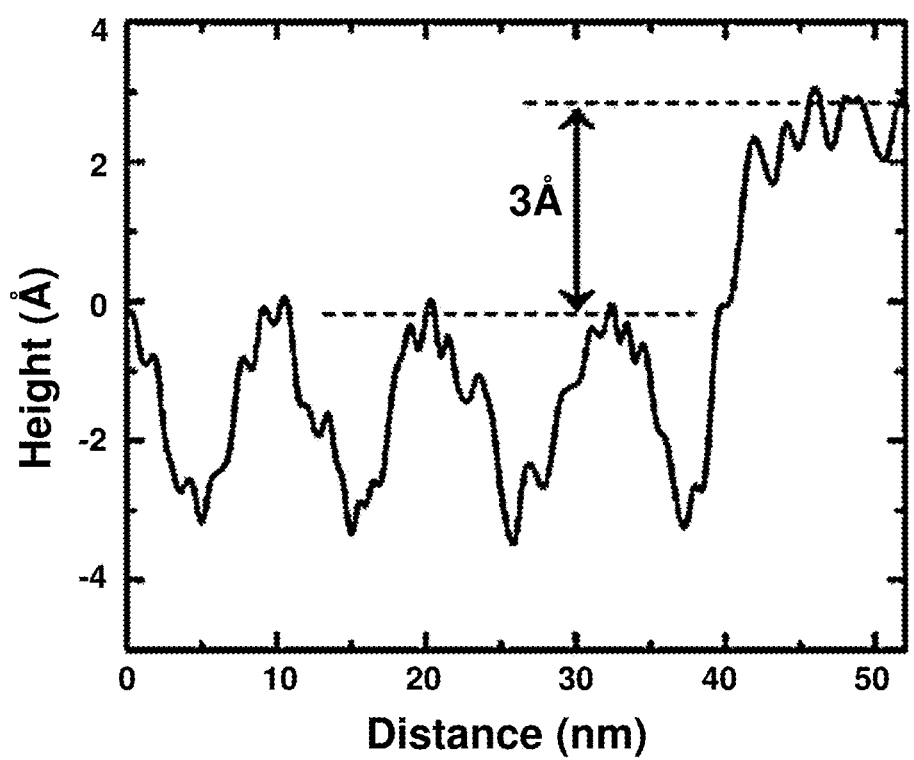
FIG. 4 is a line profile illustrating the apparent height along the segment in FIG. 3F.

At the start of the growth process, hBN nucleates and grows quickly, covering the Cu (for example) surface 25 of the substrate 30 in less than 2 min. After this initial period, second-layer islands nucleate sporadically and grow slowly as indicated in FIGS. 3A through 3D, with reference to FIGS. 1A through 2B, with an average rate of about 3 mono layers per hour. In order to assess quality, morphology, and composition, the hBN films were characterized by a suite of techniques including AFM (as shown in FIGS. 3E through 4), Raman (shown in FIGS. 5A and 5B), and XPS (as shown in FIGS. 6A and 6B). FIGS. 3E and 3F display typical phase contrast and height profile AFM images collected ex situ at room temperature. The first hBN layer shows periodic superstructures, and the second layer (bright areas in FIG. 3F) does not. A line scan from the monolayer hBN region to the bilayer region (line segment in FIG. 3F) shows an apparent height modulation for the monolayer regions; there is a height increase of 3 Å to 4 Å between the first and second hBN layers (as shown in FIGS. 4, 7, and 8A through 8F), as well as between the second and third layer (FIGS. 9 and 10A through 10F). This height increase is consistent with van der Waals ("vdW") separation between hBN layers, which were confirmed separately in TEM.

Figure 5A:
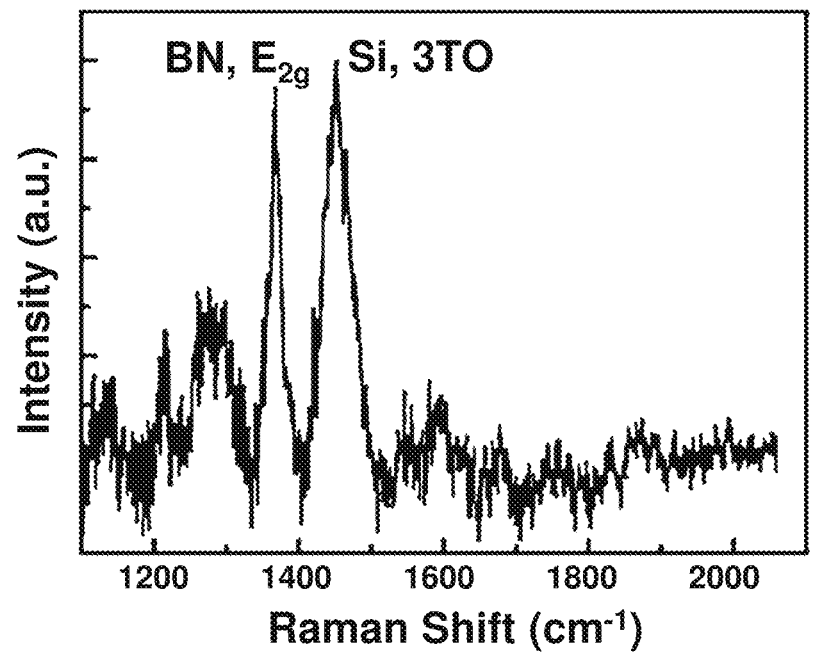
FIGS. 5A and 5B are Raman spectra for hBN after being transferred to a $SiO_2$/Si substrate and after hBN film growth for 60 min, respectively.
Figure 5B:
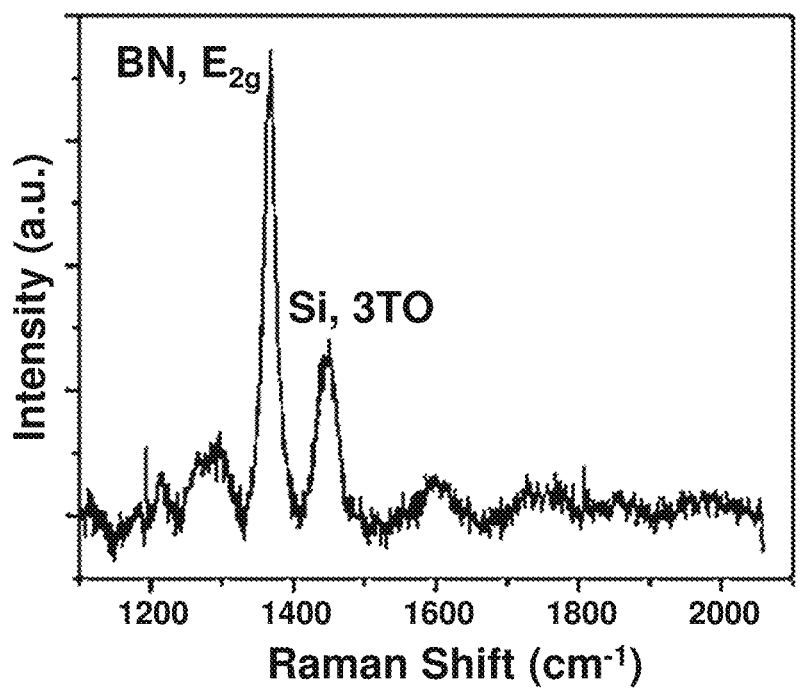
Figure 5C:
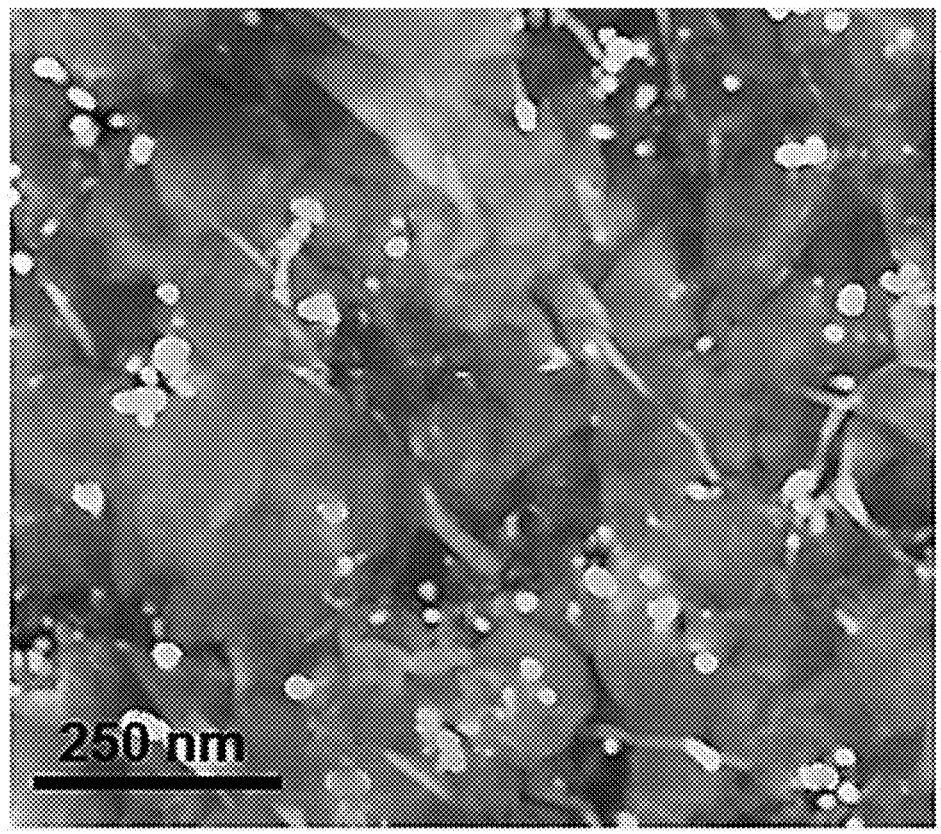
FIG. 5C is an AFM height map from hBN film grown for 60 min.
Figure 6A:
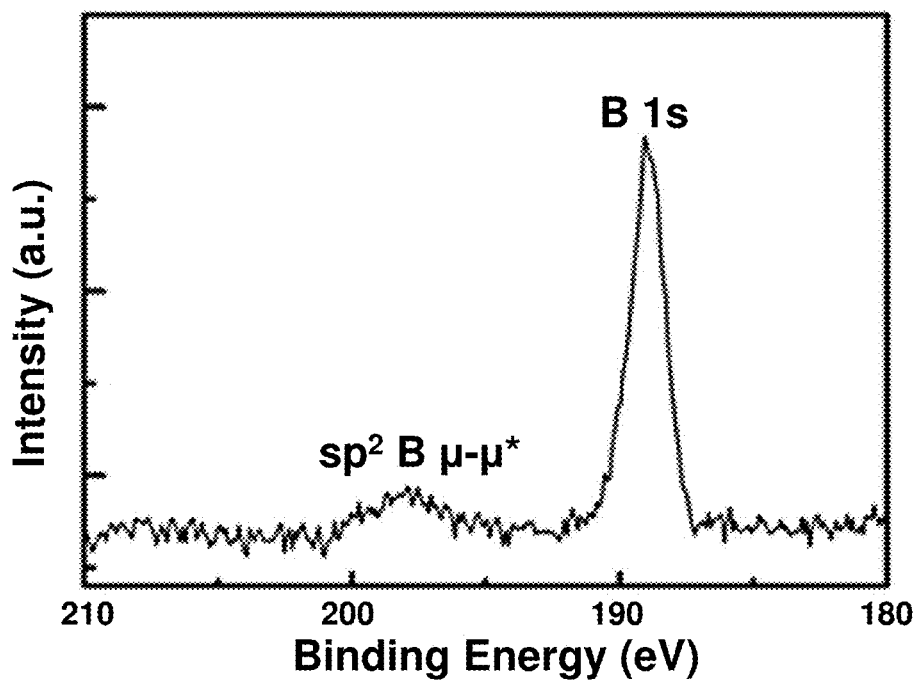
FIGS. 6A and 6B illustrate chemical analysis of hBN films using X-ray photoelectron spectroscopy (XPS).
Figure 6B:
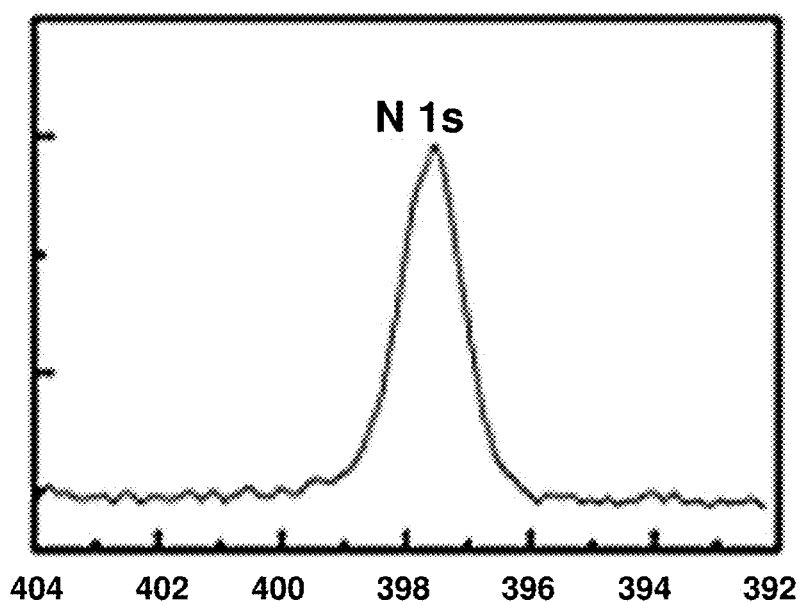

After the layers were transferred onto a $SiO_2$/Si substrate, Raman spectroscopy was performed (as shown in FIGS. 5A through 5C). FIG. 5A shows peaks at 1368 $cm^{-1}$ and 1450 $cm^{-1}$, which correspond to the $E_{2g}$ vibrational mode of $sp^2$-BN and the Si third TO mode, respectively. The peak position and narrow width (full width at half maximum (fwhm) of 20 $cm^{-1}$) of the $E_{2g}$ Raman mode are indicative of the high quality of the films.

Chemical analysis of the hBN films was performed using XPS; this analysis has yielded a B/N ratio of 1/1.01, very close to perfect stoichiometry. The B is and N is photoelectron peaks were observed at 190.2 eV and 397.6 eV (as shown in FIGS. 6A and 6B), consistent with B—N bonding and in good agreement with previous reports for mono- to few-layer hBN. At about 199 eV, a small broad emission peak is also observed in FIG. 6A, which is due to the π-π* shakeup peak characteristic to $sp^2$ bonded BN.

Figure 11B:
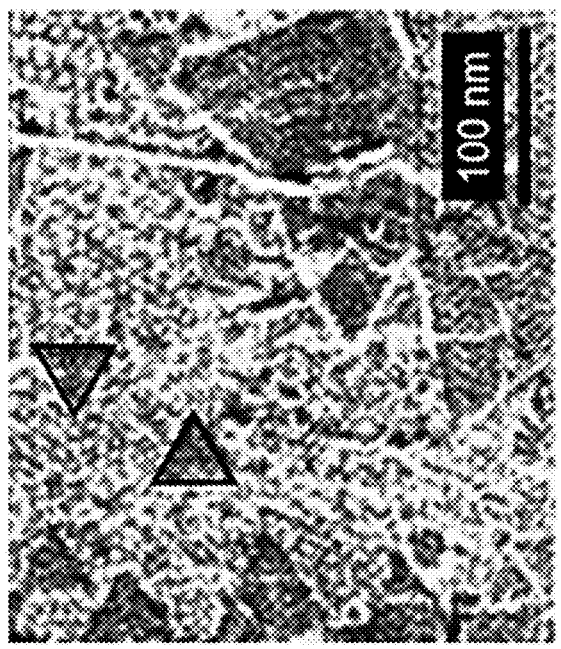
FIGS. 11A and 11B are AFM images of hBN on Cu(111) for 7 min growth time (FIG. 11A), when only single layer hBN are present (moiré patterns), and after 15 min (FIG. 11B), when second-layer hBN islands have nucleated and started to grow. Two of the triangular second-layer islands are outlined with black borders.
Figure 11A:
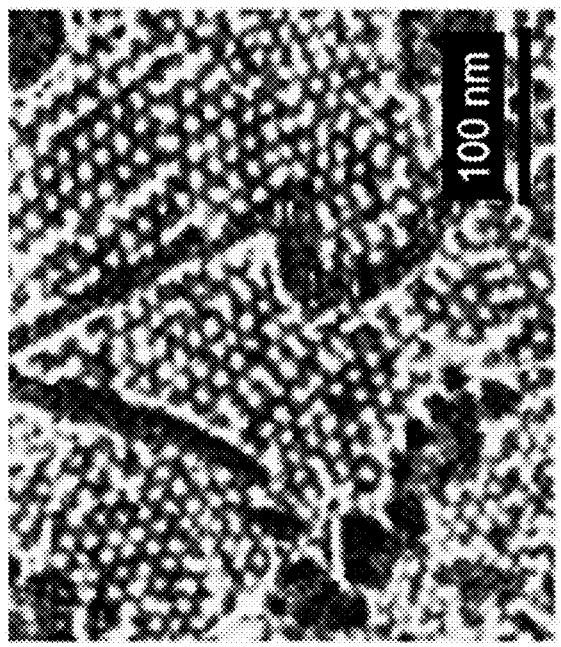

The morphology of the mono- and bilayer hBN films on Cu is illustrated in closer detail in FIGS. 11A and 11B. FIG. 11A shows the moiré patterns (superstructures) in phase-contrast AFM images for the single layer hBN regions. Similar to the height profile AFM images (FIG. 3F), phase-contrast AFM images of bilayer hBN regions (FIG. 11B) do not show any moiré patterns. While reports of moiré superstructures in phase-contrast AFM images are common, there are two puzzling observations emerging from the AFM characterization of the films. The first observation is that height-contrast AFM images show moiré superstructures in an atomically flat first hBN layer. The second observation is that the AFM images (both in phase- and height-contrast) of first and second hBN layers are drastically different; the second layer does not show any moiré patterns although it is in registry with the first hBN layer that does exhibit periodic superstructures in AFM.

Figure 12A:
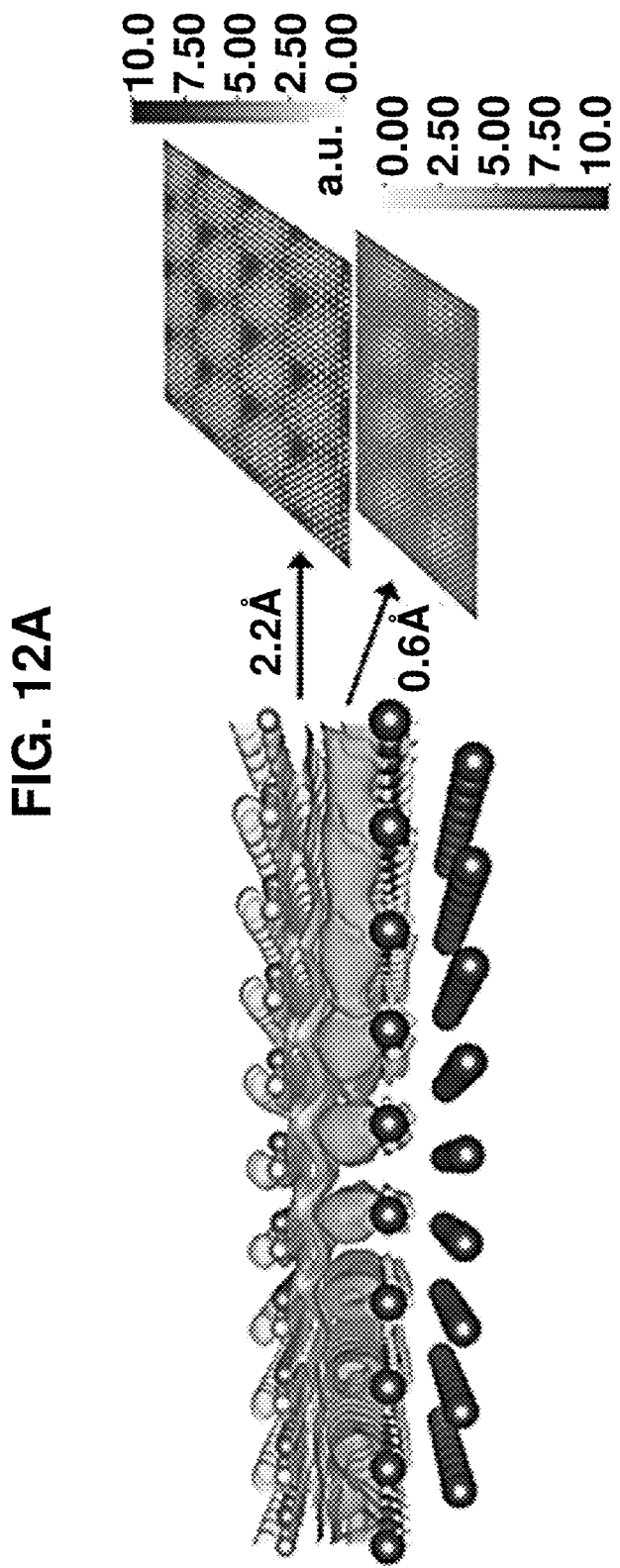
FIGS. 12A and 12B are electronic transfer plots for mono- and bilayer hBN on Cu. Positive and negative isosurfaces at the interface between the first hBN layer and Cu and between the first and second hBN layers, respectively. The isosurfaces shown are at ±0.00043 e/Bohr$^3$ and ±0.00011 e/Bohr$^3$, respectively.
Figure 12B:
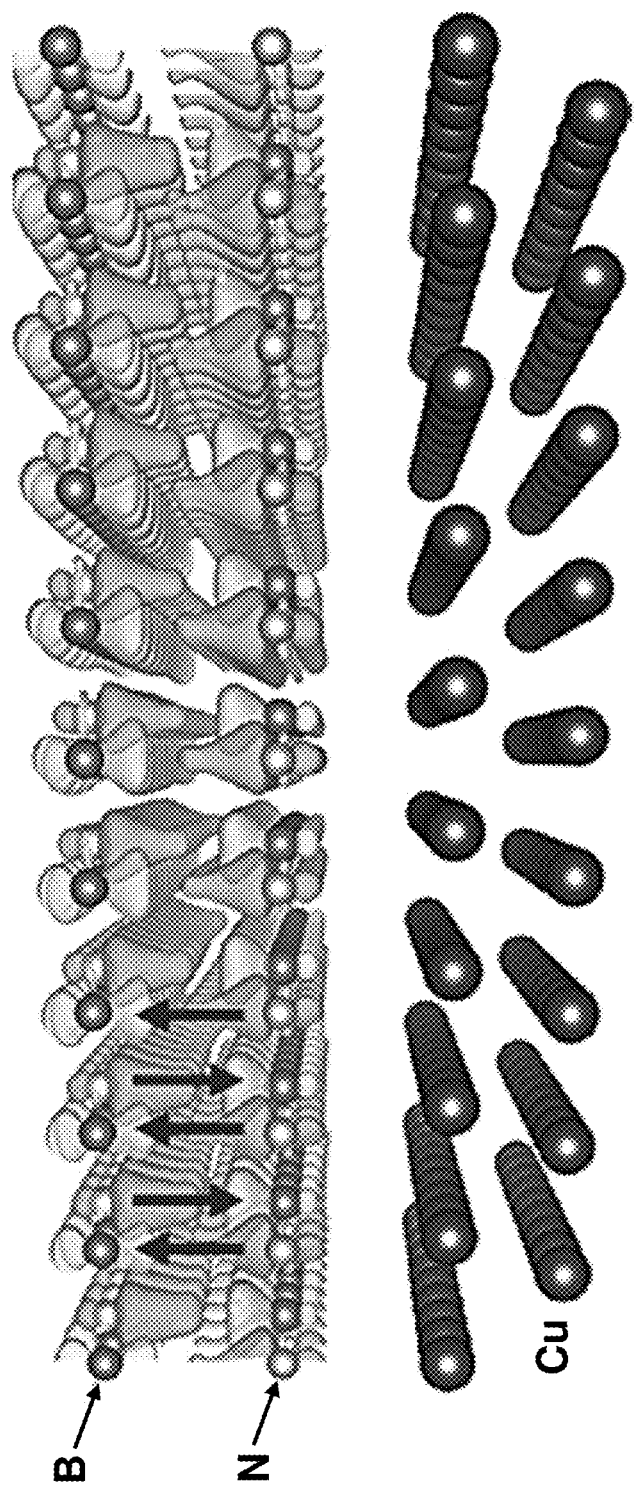

The AFM observation of moiré patterns in height profile is highly unusual for the topographically flat, vdW-bonded hBN/Cu system. Electronic effects may accompany height variations in height-contrast AFM measurements, but are not normally detected by themselves. While not wishing to be bound by theory, it is believed that variations of the forces detected by tapping mode AFM (which are eventually translated into height-contrast maps) may occur due to long-range electrostatic interactions between the AFM tip and the sample. DFT calculations may be used to understand how the electronic charge density is distributed at the hBN—Cu interface as well as at the hBN—hBN/Cu interface with the former (latter) showing the electronic transfer to the first (second) hBN layer (as shown in FIGS. 12A and 12B). FIG. 12A shows the interfacial electron transfer at the hBN—Cu interface with a gain of electronic density below the hBN layer and a density loss just above the Cu substrate. Despite in-plane inhomogeneities (FIG. 12A), the charge transfer at the hBN—Cu interface effectively results in a dipole layer that interacts electrostatically with the (usually charged) AFM tip. The strength of the dipole layer is not constant, but rather modulated by the periodicity of the computational supercell, as shown in the top views of two cross sections through the interfacial charge distribution (FIG. 12A). This in-plane modulation of the dipole strength leads to modulations in the average force between the charged AFM tip and the sample, hence explaining the moiré patterns observed in height-contrast AFM.

Given that the second hBN layer is in registry with the first hBN layer, the moiré periodicity may manifest through the second layer as well; however, this was not the result. Charge transfer at the second interface was computed with the results shown in FIG. 12B. Interestingly, we find that electrostatic dipoles do not form a layer such as that between hBN and Cu(111) but have the staggered arrangement schematically shown by the up and down arrows in FIG. 12B. The dipoles at the hBN—hBN/Cu interface change orientation from one site to another due to the registry of the two layers (AA' stacking), and therefore approximately cancel each other locally (FIG. 12B). Because of this cancelation of neighboring dipoles (FIG. 12B), the interface between the two hBN layers does not acquire a significant dipole moment per unit area. At the same time, the effect of the dipole from the first interface (hBN—Cu) is diminished because the presence of the second hBN layer leads to a larger spacing between the AFM tip and the hBN—Cu dipole layer. If dipoles are induced on the AFM tip (which is made of doped silicon) and that the second hBN layer effectively doubles the distance between the tip and the hBN—Cu dipoles, then the force on the AFM tip decreases by a factor of 24 because the dipole-dipole interaction potential varies as $r^{-3}$.

Figure 14A:
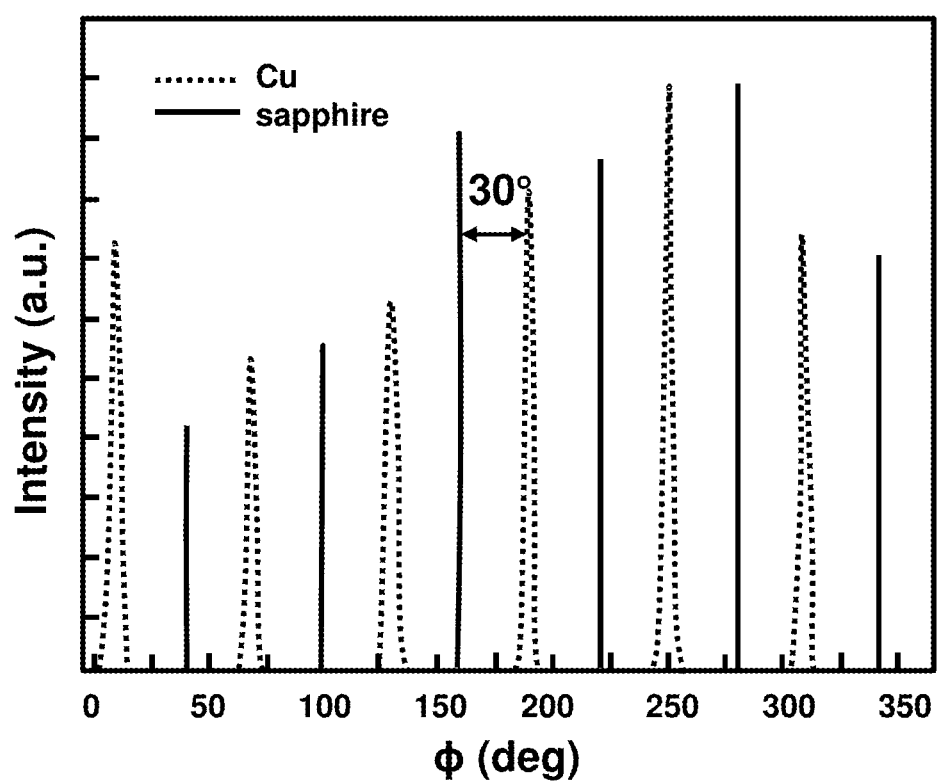
FIG. 14A are graphical representations of X-ray φ-scans of Cu on sapphire used for identifying the crystallographic directions in the Cu(111) film; these scans were taken after the growth of hBN/Cu/sapphire.
Figure 14B:
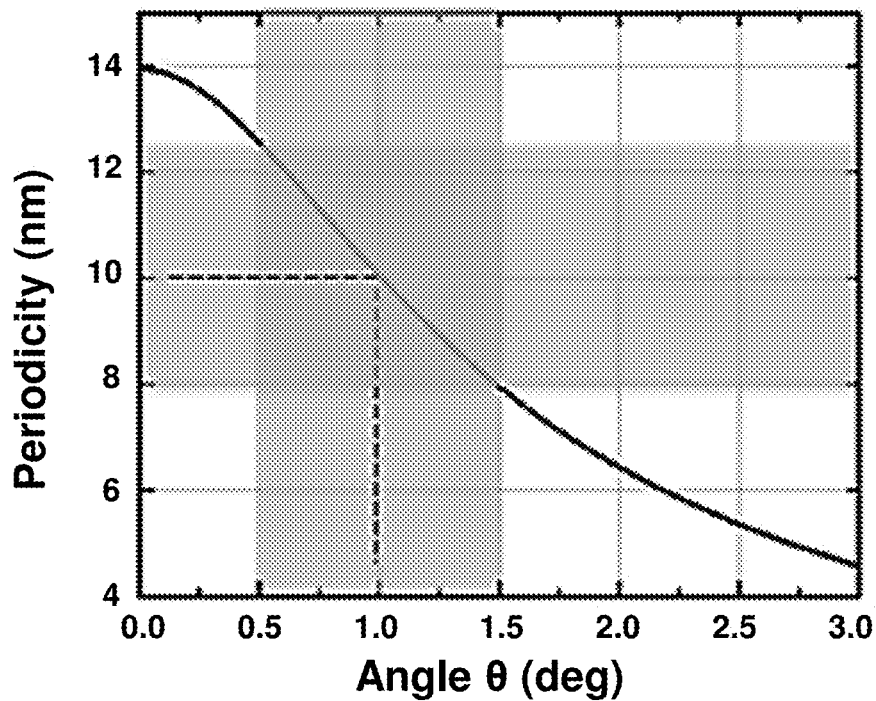
FIG. 14B is a spatial period of the moiré pattern as a function of the (misorientation) angle θ between the hBN zigzag direction and Cu[1$\bar{1}$1]. Most misorientation angles observed fall between 0.5° and 1.5°, leading to patterns with periodicities between 8.0 nm and 12.5 nm.
Figure 14C:
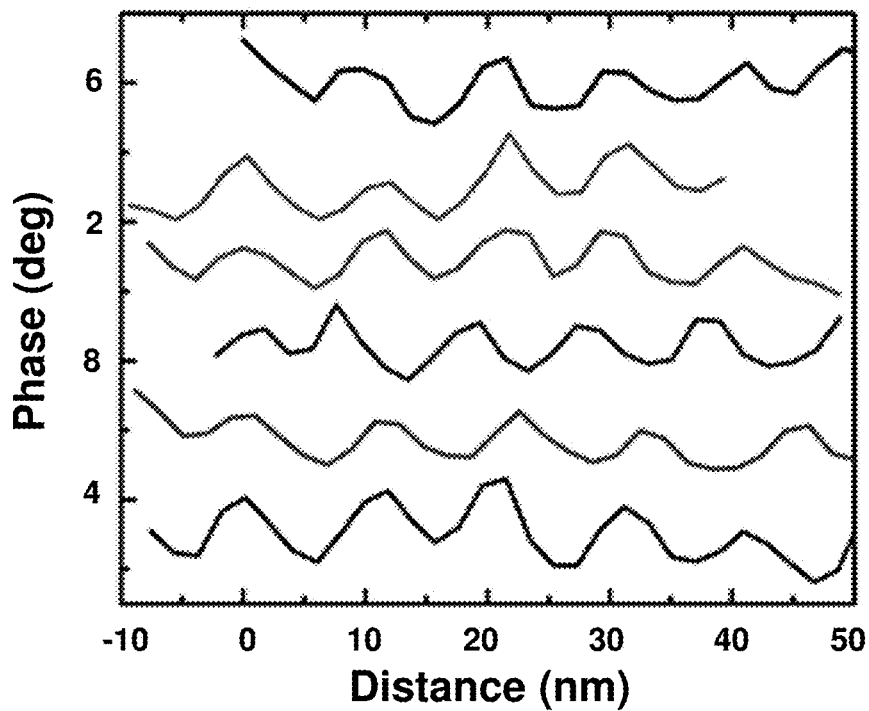
FIG. 14C graphically illustrates line profiles through phase-contrast AFM images showing spatial periodicities in the 8.0 Å to 12.5 Å range.
Figure 16:
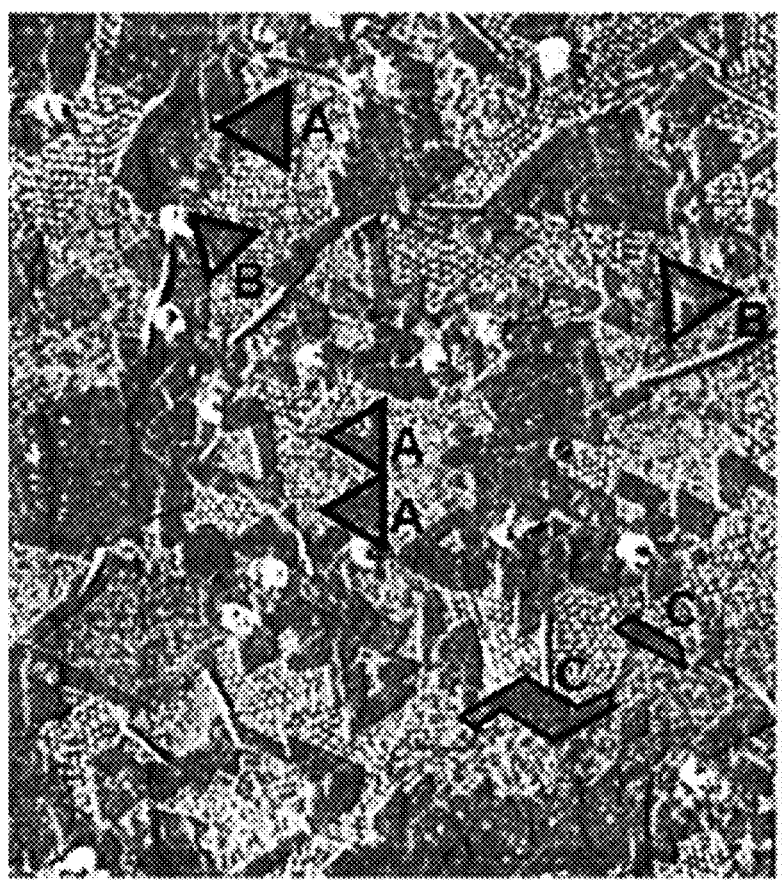
FIG. 16 is a base contrast AFM image (1 μm×1 μm) showing different morphologies of the second-layer hBN islands of FIG. 15, such as triangle-left (A), triangle-right (B), and ribbons (C).

The epitaxial relationship between the first hBN layer and the substrate 30. This is revealed in FIGS. 13A through 14C. This relationship was determined by performing X-ray φ-scans for Cu/sapphire and hBN/Cu/sapphire (FIG. 14A) in combination with studying the lattice geometries of the hBN/Cu system (FIGS. 13A and 14C) and the spatial periodicities of AFM line scans (FIG. 14C). At the start, the axes of the Cu(111) substrate were determined by Xray φ-scans for Cu/sapphire. The φ-scans from the Cu(111) film and the sapphire (0001) substrate (FIG. 14A) reveal six symmetric diffraction peaks, indicating that the Cu is oriented with respect to sapphire such that <111>∥<0001> and <110>∥<11$\bar{2}$0>. With the sapphire [11$\bar{2}$0] direction identified, the AFM scan direction was aligned perpendicular to it (FIG. 14). In the acquired scans, one of the observed edges of triangular hBN islands was always nearly perpendicular to the AFM scan direction, and hence that edge was parallel with sapphire [11$\bar{2}$0] and with Cu1$\bar{1}$0[ ]. In a nitrogen-rich environment, the edges of triangular hBN islands (oriented at 60° with each other) are zigzag. Thus, the zigzag direction in the hBN layers is parallel (or nearly so) to Cu[1$\bar{1}$0] (FIG. 13A).

To characterize the more precisely angular deviation, θ, between a zigzag direction of hBN and the Cu[1$\bar{1}$0] axis, moiré patterns in AFM in conjunction with lattice simulations of moiré superstructures were considered. Such simulations are appropriate for vdW-bonded layers that do not change their lattice constants upon bonding, because the hBN—Cu bonding is weak and yield spatial periodicities that depend on the misorientation and the values of the lattice constants. The lattice constants for BN and Cu were parameterized so as to obtain the best agreement with previously published moiré structure periodicities for hBN on Cu; this agreement was obtained for 2.511 Å and 2.560 Å for hBN and Cu, respectively. The values vary little from the experimental lattice constants of 2.50 Å for monolayer hBN, and 2.556 Å for Cu(111) (=3.615 Å/√2, because the room-temperature bulk lattice constant of Cu is 3.615 Å). A uniform strain model was not expected to be able to cover subtleties of moiré structures (e.g., changes with temperature). The moiré periodicity varies rapidly with θ (lattice simulation result, FIG. 14B), going from 14 nm at 0° to 5 nm at 3°. The most prevalent spatial periodicity in the AFM images is about 10 nm (atomic structure shown in FIG. 13A; FIG. 13B is an enlargement of the parallelogram of FIG. 13A), which is obtained for 0=1.0° in the lattice simulations. Most observed moiré periodicities with AFM fell in the range from 8.0 nm to 12.5 nm (FIG. 14C); the simulation results imply that misorientation angles of the first hBN layer are all smaller than 1.5°. This alignment is consistent reports of monolayer hBN island orientation on Cu but shows significantly smaller misorientation angles.

Figure 17:
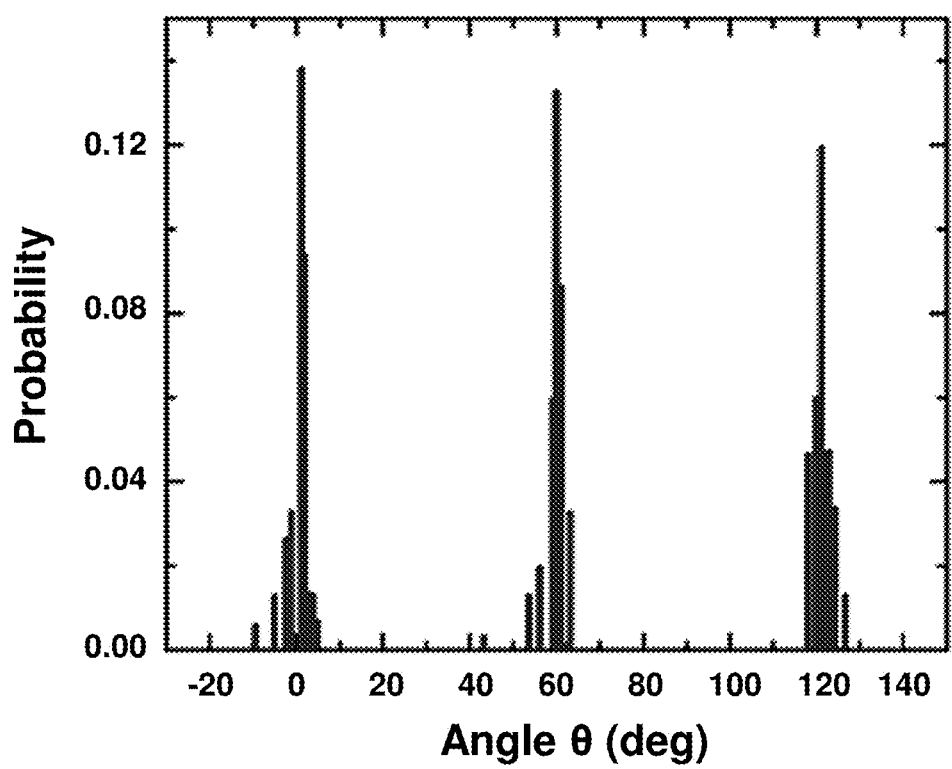
FIG. 17 is a histogram of the orientations of all edges of the second layer islands in FIG. 16.

With this assessment of the near-perfect alignment of the first hBN layer on Cu(111), are turning now to discussing briefly the second and third layer, FIGS. 15A and 15B show representative cross sectional TEM images of large-area, bi- and trilayer hBN films. These images show straight, ordered hBN layers parallel to the (111) planes of the substrate. Taking a closer look at the orientation of the second layer islands, FIG. 16 displays a large area AFM image in which these islands form shapes such as triangles pointing right, triangles pointing left, or ribbons (e.g., elongated parallelograms or trapezoids). The orientation of each edge was analyzed and found belonging to these islands, and plotted the results in the form of a histogram (as shown in FIG. 17). FIG. 17 shows that within experimental uncertainties there are only three orientations for the edges of the second-layer islands, situated at 60° away from each other and parallel to the <11$\bar{2}$0> (family of) directions in sapphire. This suggests the second hBN layer is epitaxially aligned with the first, which is expected based on the most stable stacking in bulk hBN and also in bilayer hBN (AA').

Again, while not wishing to be bound by theory, a proposed mechanism for the growth on top an already present hBN layer, when the influence of the metal substrate on precursor reactions is negligible is described. Because the temperature of the substrate 30 is significantly higher than the pyrolysis temperature of TEB, TEB may adsorb on the surface 25 of the substrate 30 as boron atoms or boron-containing radicals. This indicates that the limiting steps for the growth of additional hBN layers 35, 40 are very likely the adsorption and dehydrogenation of ammonia and its radicals on the surface 25.

On bare Cu(111), adsorption and dehydrogenation of ammonia and its radicals are facilitated by the catalytic activity of the Cu substrate. The adsorption energies on bare Cu(111) are −0.819 eV (for $NH_3$ at the top site), −3.358 eV ($NH_2$, bridge site), and −5.763 eV (NH, fcc site); these are consistent with conventional data that uses a different exchange-correlation energy functional. DFT calculations show that the three dehydrogenation steps on bare Cu(111) encounter barriers of 1.84 eV ($NH_3$ to $NH_2$), 1.59 eV ($NH_2$ to NH), and 2.19 eV (NH to N). Although the temperature according to embodiment of the present invention is less than 1000° C. (or, specifically about 900° C. for particular illustrative embodiments) (0.1 eV) is significantly smaller than these activation energies on bare Cu, it still allows for the reactions to proceed when sufficient ammonia molecules are adsorbed. Indeed, relatively rapid formation of the first layer was observed on Cu(111).

The catalytic influence of underlying Cu substrate is diminished after the growth of the first hBN monolayer. Indeed, DFT calculations show that the adsorption of ammonia on hBN/Cu (−0.167 eV; FIG. 18A) and on hBN/hBN/ . . . /hBN/Cu (−0.138 eV; FIG. 18B) is weaker than that of ammonia on bare Cu (−0.819 eV). In fact, from a kinetics point-of-view, adsorption of ammonia is very inefficient at the growth temperature of 900° C. (0.101 eV). Using the Evans-Polanyi principle that correlates activation barriers for dehydrogenation with the adsorption energies of surface intermediates (i.e., $NH_x$ radicals), dehydrogenation trends were assed via comparisons of the adsorption energies for $NH_x$ on hBN/Cu (x=1, 2). The radicals $NH_2$ and NH adsorb well on hBN/Cu (i.e., sufficiently large adsorption energies, FIG. 18A), so that the dehydrogenation is possible on hBN/Cu when ammonia stays adsorbed. This expectation is borne out of observations showing that the growth of an hBN layer on top of hBN/Cu is not only possible, but also controllable via exposure times. Furthermore, because the exponential factors related to activation energies are of the same orders of magnitude as those related to adsorption, how much slower the reaction proceeds on hBN/Cu in comparison to bare Cu(111) at the same temperature of 900° C. may be estimated. On the basis of adsorption energies of $NH_2$, the ratio of the corresponding activation rates is exp[(−3.358+2.651)eV/kBT]≈1/69, that is, the rate of growth on hBN/Cu is estimated to be about 69 times slower than that on Cu(111). This is consistent with the observed, slow growth of the second hBN layer (FIGS. 5B and 5C); the growth rate of the second layer is about two-orders of magnitude slower than that of the first layer.

For growth of hBN layers atop the second one (as shown in FIG. 18B), two important observations are made. First, ammonia adsorbs on hBN(0001) with an adsorption energy even weaker than that on hBN/Cu (FIG. 18B). Second, the NH intermediate adsorbs with a significant energy on hBN(0001), −2.259 eV; this strong adsorption is due to the NH radical in a bridge position wherein it bonds both with the N and the B atoms of the underlying BN sheet. While adsorption of ammonia and of NH on hBN(0001) are necessary conditions for enabling the growth of hBN layers past the second one, it is not sufficient because the adsorption of $NH_3$ and of $NH_2$ on hBN(0001) are too weak. The adsorption of ammonia and its dehydrogenation to $NH_2$ on the hBN/hBN/ . . . /Cu(111) surface are therefore the bottlenecks impeding the formation of multilayer hBN on metal substrates that are rendered catalytically inactive by virtue of being covered with hBN.

As to the presence of radicals from the TEB on the surface 25 of the substrate 30, illustrated by further DFT calculations and reactive molecular dynamics (MD) simulations, the presence of pyrolysis products from TEB (e.g., B and BH) on the surface 25 of the substrate 30 is the key factor that enables multilayer hBN growth. DFT calculations show that B adatoms on hBN(0001) are strong binding sites for ammonia. The B adatoms attract $NH_3$ in a facile manner when $NH_3$ is placed within a lattice constant. Furthermore, the adsorption energy at a B-adatom (−2.61 eV) is significantly stronger than that on bare Cu (−0.819 eV).

Figure 19A:
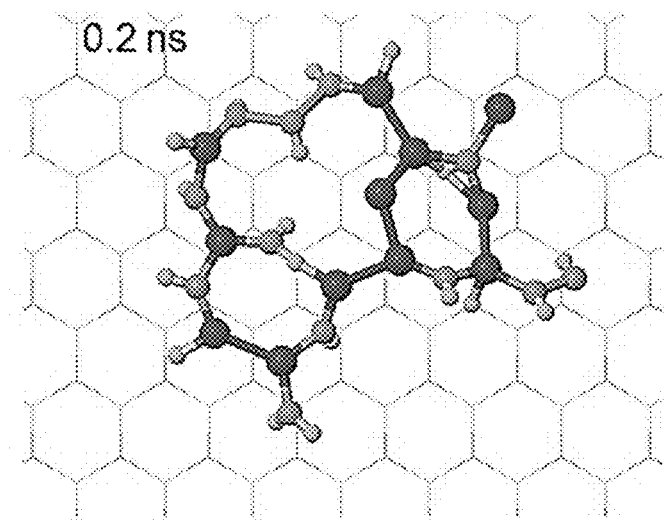
FIG. 19A illustrates a six-atom ring formation in molecular dynamics simulations with the Reaxff potential. Early on (0.2 ns), there are large clusters formed on the surface by virtue of diffusion of B-based and N-based radicals on the surface.
Figure 19B:
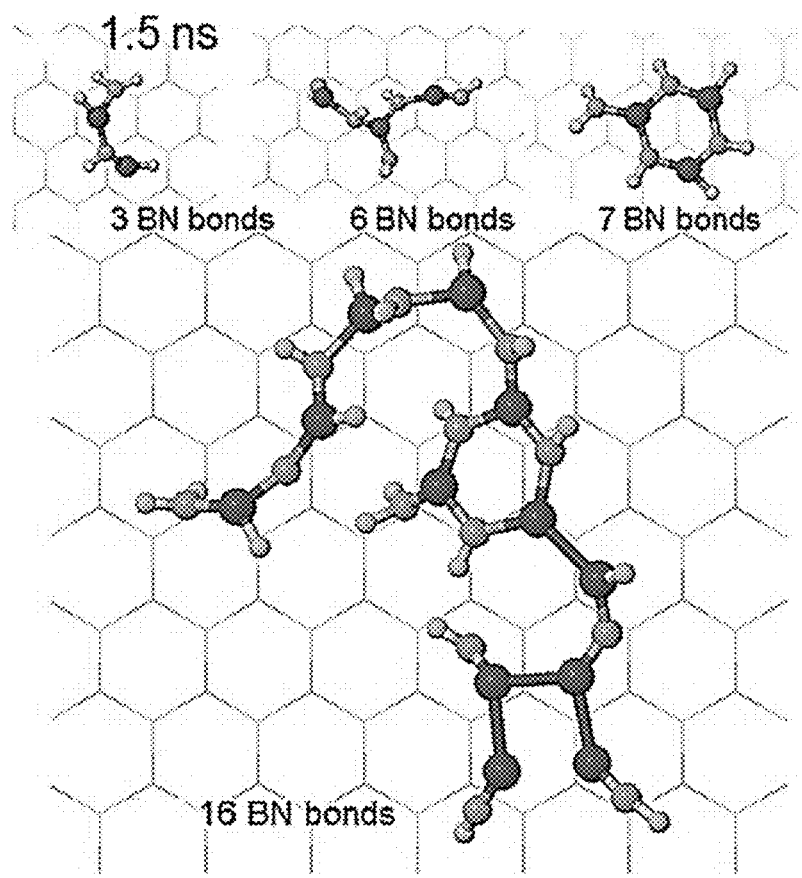
FIG. 19B illustrates clusters of FIG. 19A reorganizing to six-atom rings with tethering polymerized B—N bonds (1.5 ns).

In order to gain further insights into the initial stages of new hBN layer formation on hBN(0001), reactive MD simulations on systems with N-based and B-based radicals on the surface 25 of the substrate 30 may be used. Because the time scales involved in this process are not accessible to DFT calculations, a realistic reactive force field (Reaxff) to model the atomic interactions was used. In the MD simulations, an equal number of $NH_x$ radicals and B adatoms was employed, amounting to one radical/adatom for every four surface unit cells; these simulations have been carried out at 900° C. and 1200° C. with similar results. In the beginning, the radicals diffuse onto the surface 25 and quickly form rather large clusters, some of which have a large number of "wrong" B—B or N—N bonds (FIG. 19A). However, enabled by the presence of highly reactive B adatoms and sufficiently large temperatures, these clusters reorganize rapidly so as to increase the number of energetically favorable B—N bonds. The MD simulations show that this reorganization involves complex processes in which clusters diffuse, coalesce, and break apart; these processes result in the formation of BN polymers and six-atom rings. For example, FIG. 19B shows that different polymerized B—N bonds/complexes coexist dynamically and diffuse on the surface 25; complexes with three, six, seven (ring with one B—N bond tethering), and 16 (ring with a 9-bond polymer tethering) contiguous B—N bonds can all be present simultaneously on the surface 25 of the substrate 30.

MD simulations provide an estimate for the time scales required to form six-atom rings at the chosen surface coverage: 1 ring/ns at 900° C., and 2 rings/ns, approximately, at 1200° C. Another important insight from MD simulations is an a posteriori confirmation that the temperature according to embodiments herein is sufficient to drive the system toward forming six-atom rings by enabling it to cross barriers associated with highly complex processes (as opposed to the elementary process of dehydrogenation already discussed). The formation of these polymerized B—N bonds and six-atom rings is made possible strictly because of the pyrolysis products on the surface 25 of the substrate 30, because the catalytic action of the metal is completely obliterated by the previously deposited hBN layers. In this respect, the polymerization is not much different than that proposed to occur on metal surfaces, where diffusion and polymerization of BN bonds were enabled by the defects in the substrate 30. A key difference here is that growth can occur on perfect hBN substrates without any defects, because the pyrolysis products of the B-containing precursor enable, simultaneously, the dehydrogenation of ammonia and formation of complexes with BN bonds. These complexes ultimately polymerize, dehydrogenate, and form a new hBN layer.

The above description of DFT calculations and MD simulations of ammonia and $NH_x$ radicals on hBN(0001) in the presence of (some of the) TEB pyrolysis products brings evidence to support the mechanism proposed. The mechanism is versatile for a number of reasons. First, the idea of using radicals from one source to activate the other precursor is independent of the metallic substrate underneath. In fact, it could be operational for the growth of multilayers of hBN even on inert substrates such as sapphire, because even though the hBN-covered substrate is not by itself active it becomes so because of the pyrolysis products that are adsorbed on it. Second, if the pyrolysis temperature for the B-containing precursor is attained at the surface 25, then the mechanism would be also independent of the precise nature of the B precursor. As such, it would be applicable to the growth from ammonia and diborane as well, especially when all other plausible mechanisms have been ruled out.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

EXAMPLES

In an experiment, hBN layers were grown in a low-pressure MOCVD reactor with an actively cooled close-coupled showerhead ("CCS") at 20 Torr from TEB and $NH_3$. The CCS shower head design allows for separate injection of the cooled (50° C.) TEB and $NH_3$ precursors 20, 21 until just above (11 mm) the heat substrate carrier.

The Cu (111)/sapphire substrates were prepared by sputtering 500 nm of Cu on epi-ready c-plane sapphire substrates at 250 W in 3 mTorr of Ar at 100° C. As deposited Cu films are (111) oriented with a typical RMF roughness of about 2 nm (FIGS. 20A through 20C). Prior to loading for h-BN growth, the Cu/sapphire substrates were degreased then etched in acetic acid to remove contamination and oxides. Substrates 30 are heated to 850° C. and annealed for 30 min in palladium purified $H_2$ to improve surface morphology and remove any residual oxide. After annealing, the substrates 30 are heated to a growth temperature of 950° C. followed by $NH_3$ and TEB injection. A V/III ratio of 1250 was used at a total flow rate of 3 slm with 250 sccm of $NH_3$, 10 μmol/min of TEB and balance $H_2$. After growth, the samples were cooled in $NH_3$ and $H_2$ down to 700° C., and then cooled to room temperature in $H_2$.

Alternatively, copper films were deposited on sapphire substrates (c-plane) via sputtering at 100° C. The substrates 30 were then transferred to a low pressure MOCVD reactor and annealed in hydrogen at 830° C. for 30 min. The substrates 30 were then heated to 900° C. and the boron nitride films were grown at 20 Torr using precursors 20, 21 of TEB and $NH_3$ for boron and nitrogen, respectively. The precursor V/III ratio was held at 1125 for growth of hBN films. The films were subsequently cooled to room temperature before being characterized.

The films were characterized using AFM, XRD, Raman, XPS, and TEM. The AFM was conducted with a Bruker® Dimension Fast Scan using a standard TESPA tip in soft tapping mode to show surface topography and phase contrast. XRD φ- and 2θ scans were done using a PANalytical® Empyrean® X-ray diffractometer to measure crystallinity and alignment of the copper film on sapphire. Raman spectra were measured using a Renishaw® inVia® system that indicated the quality of the boron nitride films. XPS was also used to confirm the bonding nature of the boron nitride films and was collected using a PHI (PerkinElmer®) 55000 XPS with an Al Kα X-ray source. Cross-sectional TEM samples were prepared using the in situ FIB lift out technique on an FEI Dual Beam FIB/SEM. The samples were then imaged with a FEI® Tecnai TF-20 FEG/TEM operated at 200 kV in high-resolution ("HR") TEM mode.

The data collection itself was tuned such that the moiré patterns appeared most strongly and clearly. This was done by reducing the Z-height of the tip, configuring the gains for optimal tracking, and adjusting the amplitude set point just below the threshold of loss of signal. Data was collected over 1 µm×1 µm areas at a set scan rate of 1 Hz (2 µm/sec) with 512×512 data points. High resolution scans were done over 250 nm×250 nm areas at 1 Hz (500 nm/sec) also using a 512×512 collection grid. XPS was used to characterize the chemical composition and bonding environment of films. An accumulation of 120 scans, each of 30 sec duration, were collected using a 4 mW, 488 nm excitation source, 20 µm slits, and 3000 line/mm grating for each measurement. For Raman characterization films were transferred from the Cu/sapphire substrates to 300 nm thick $SiO_2$ on Si handle substrates. A poly(methyl methacrylate) PMMA layer was coated onto the hBN film, and then the Cu was dissolved in 0.1 M ammonium persulfate, the PMMA/BN stack was then rinsed in DI water and transferred to the $SiO_2$/Si substrate. The PMMA was removed by dissolving in acetone at 55° C. Results from these characterization methods have been included in FIGS. 3A through 3F and 5A through 6B.

Additional Raman and AFM characterization of hBN grown for 60 min is shown in FIGS. 5B and 5C. Raman shows only peaks corresponding to the hBN $E_{2g}$ and Si $3^{rd}$ order TO modes.

Figure 7:
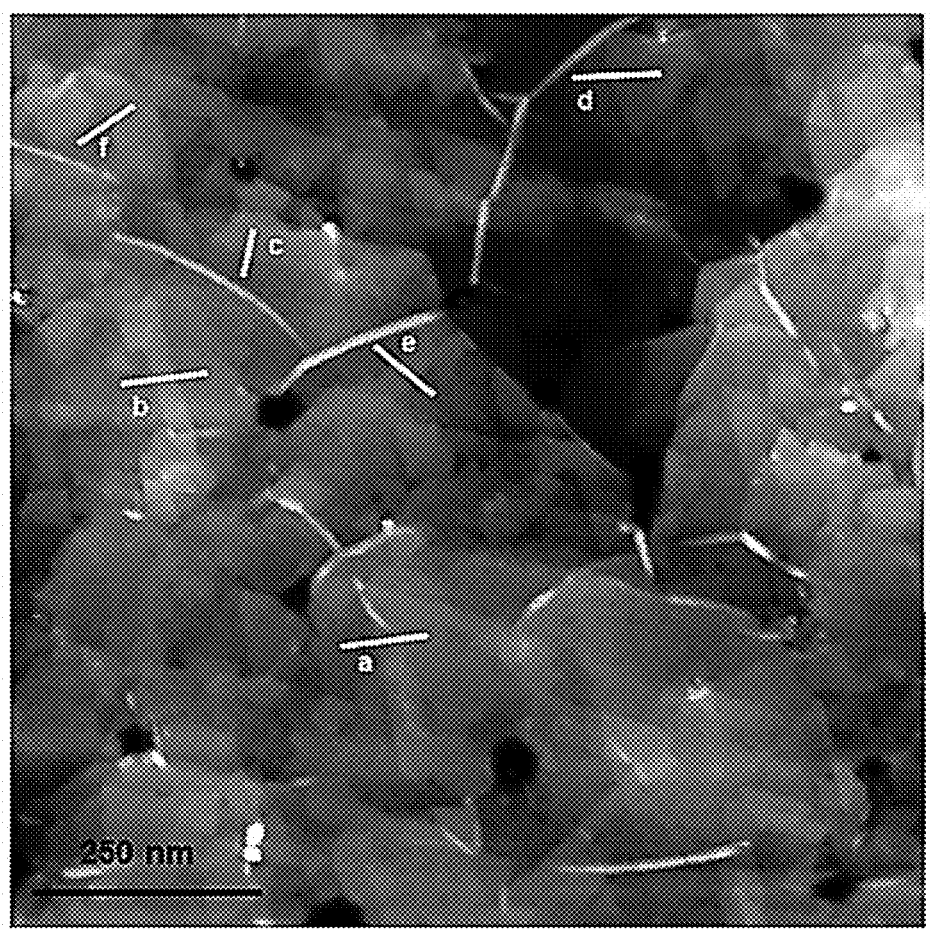
FIG. 7 is an AFM height-contrast image showing mono- and bilayers of hBN.
Figure 8A:
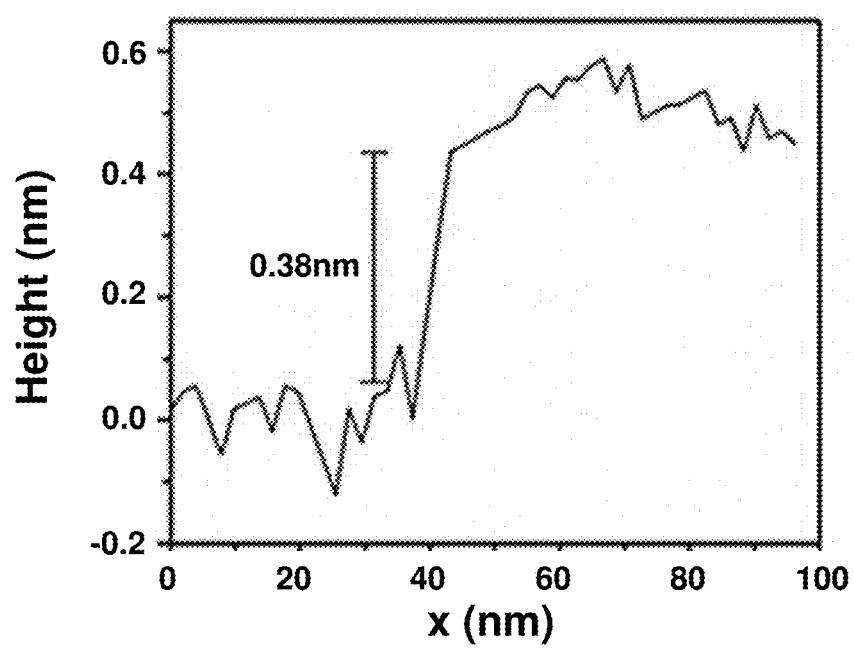
FIGS. 8A through 8F are six-line scans corresponding with lines A-F, respectively, in FIG. 7.
Figure 8B:
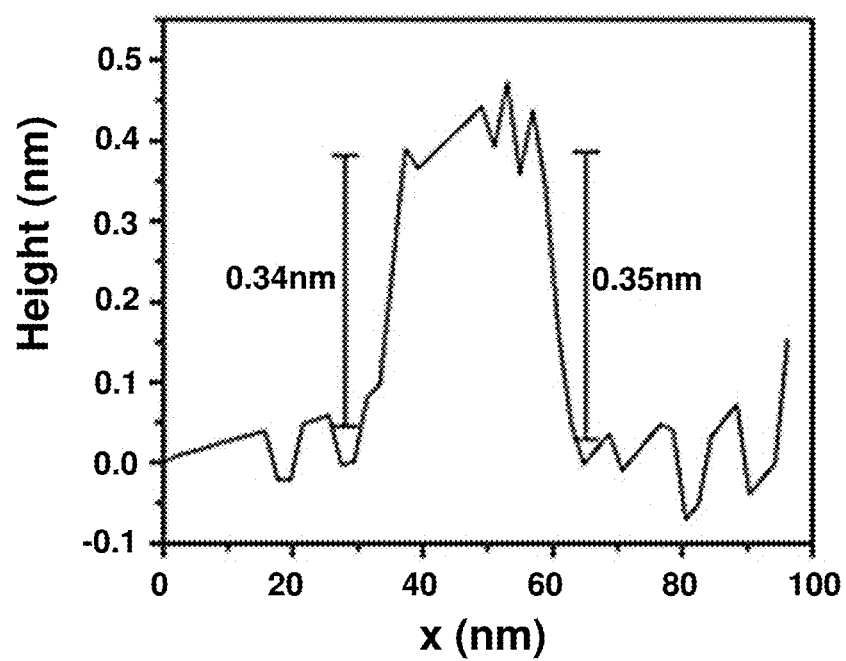
Figure 8C:
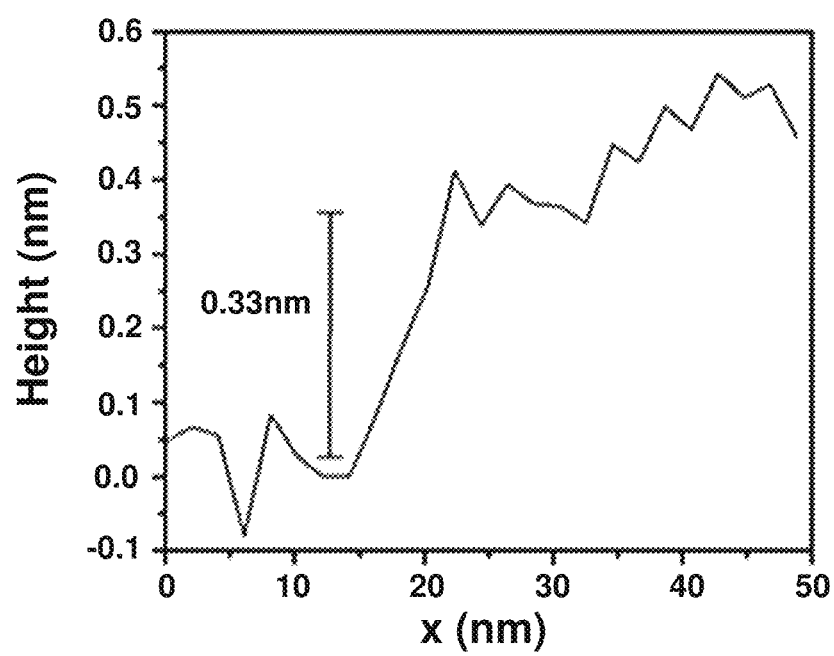
Figure 8D:
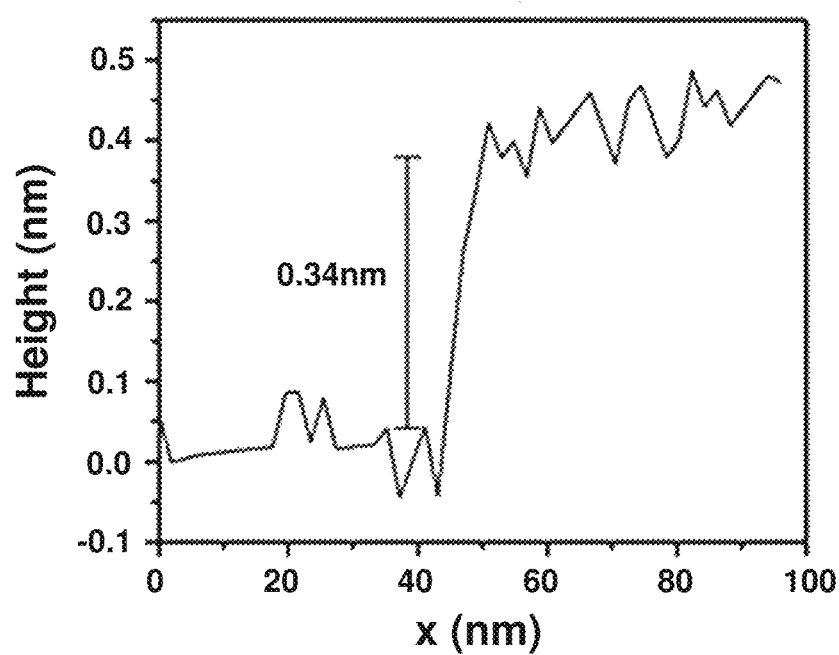
Figure 8E:
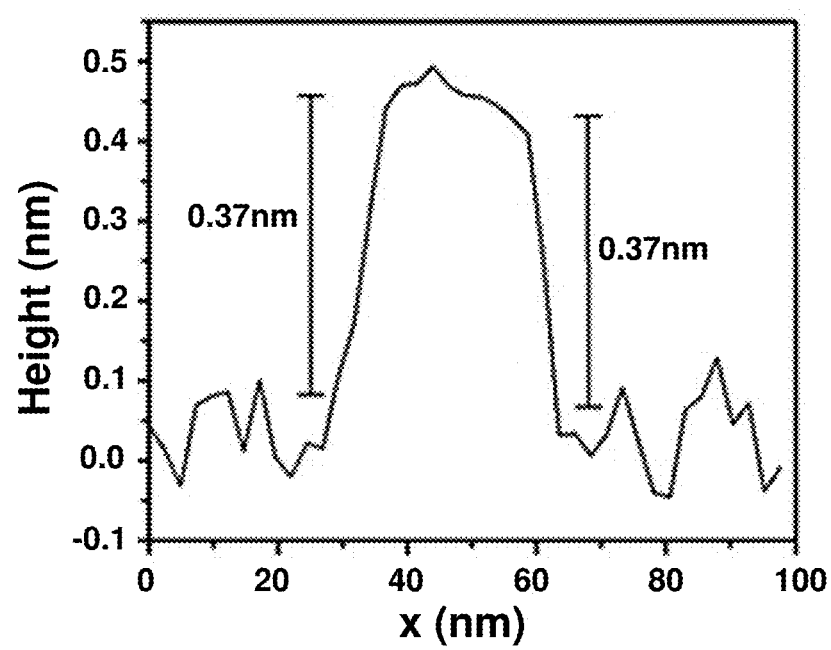
Figure 8F:
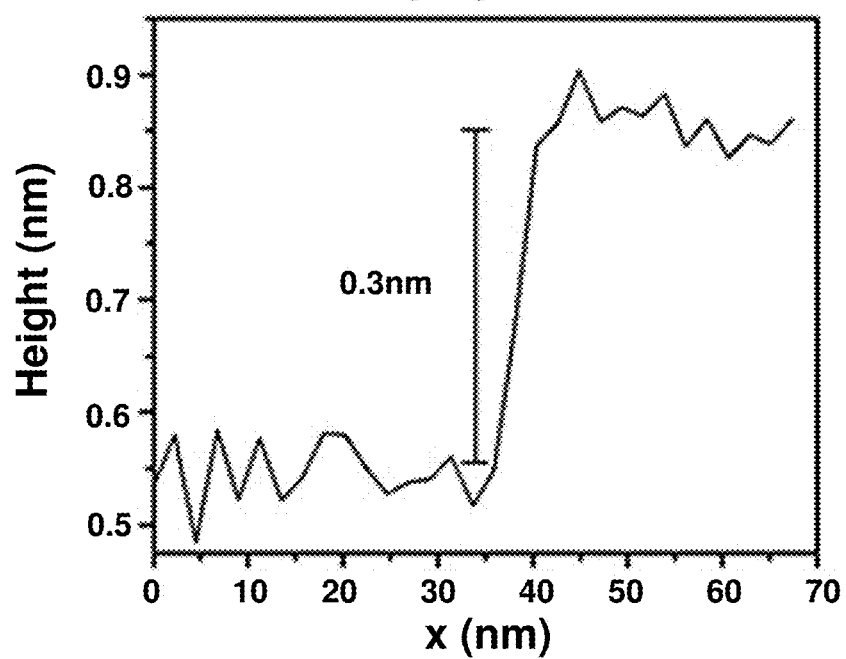

AFM height data taken from a sample with mono and bi-layer thick hBN is shown in FIGS. 7 through 8F. Line scans across six different mono- to bi-layer steps show height differences from 0.3 nm to 0.38 nm. Within experimental uncertainties, these height variations are consistent with the known vdW-separation between two hBN atomic layers.

Figure 9:
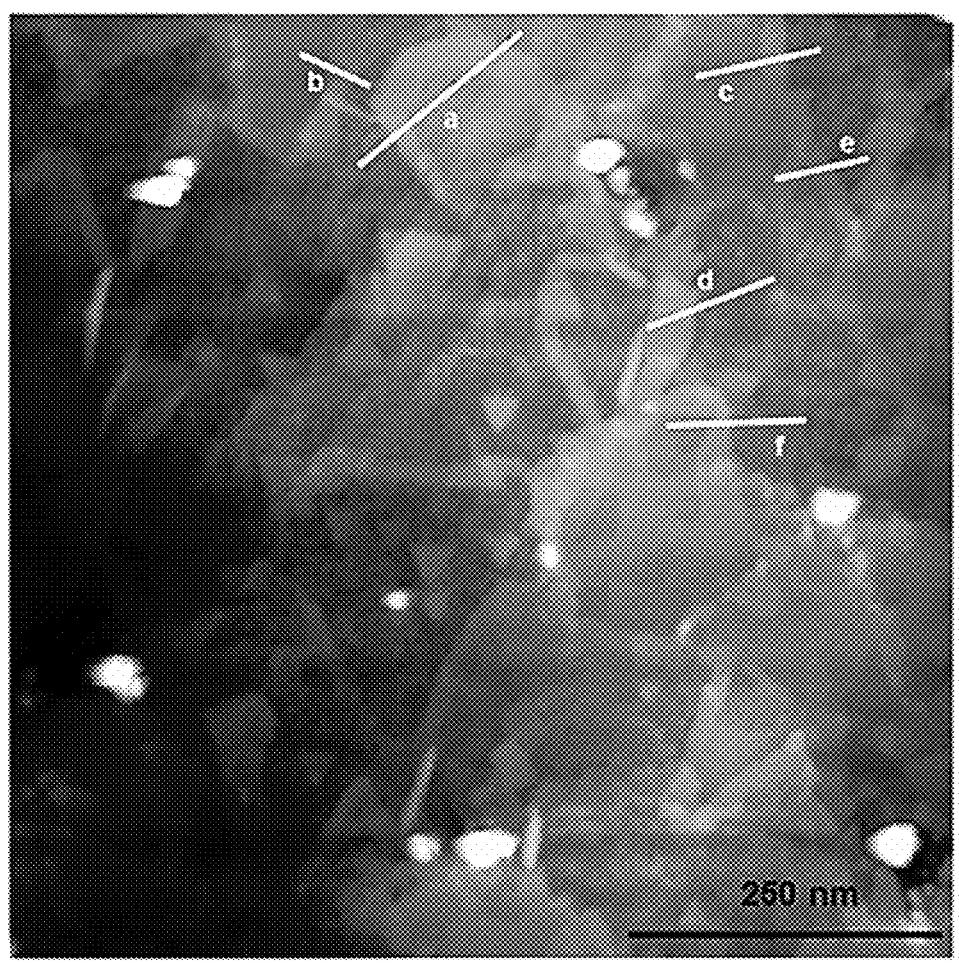
FIG. 9 is an AFM height-contrast image showing mono-, bi-, and trilayers of hBN.
Figure 10A:
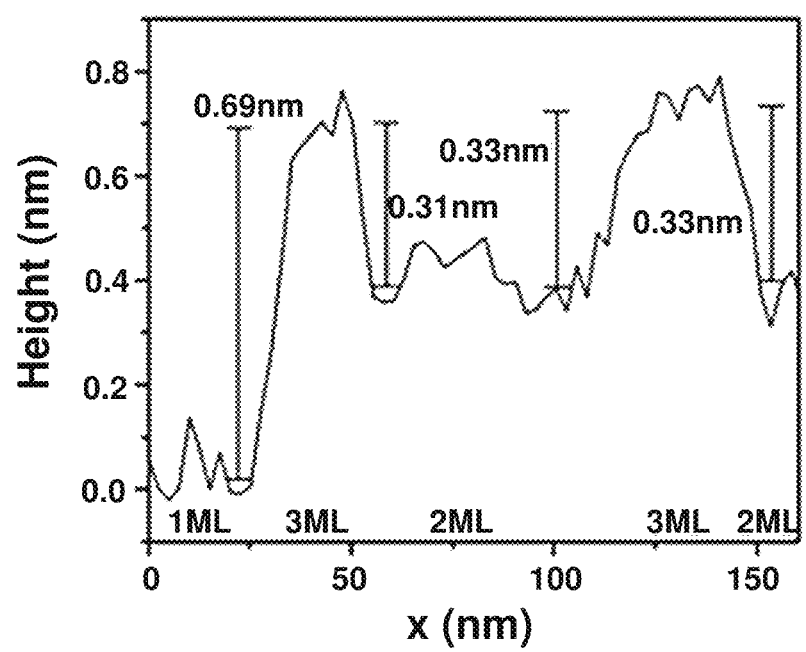
FIGS. 10A through 10F are six-line scans corresponding with lines A-F, respectively, in FIG. 9.
Figure 10B:
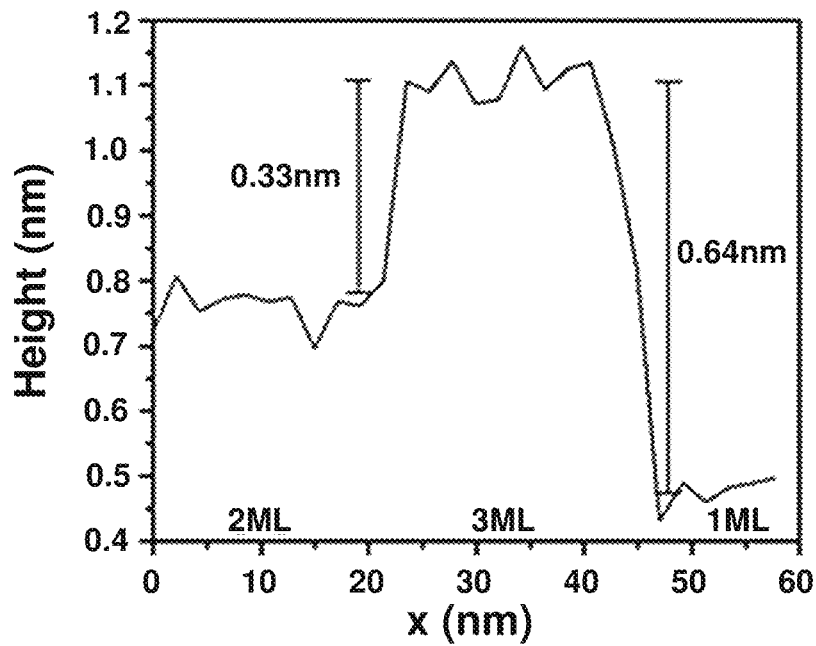
Figure 10C:
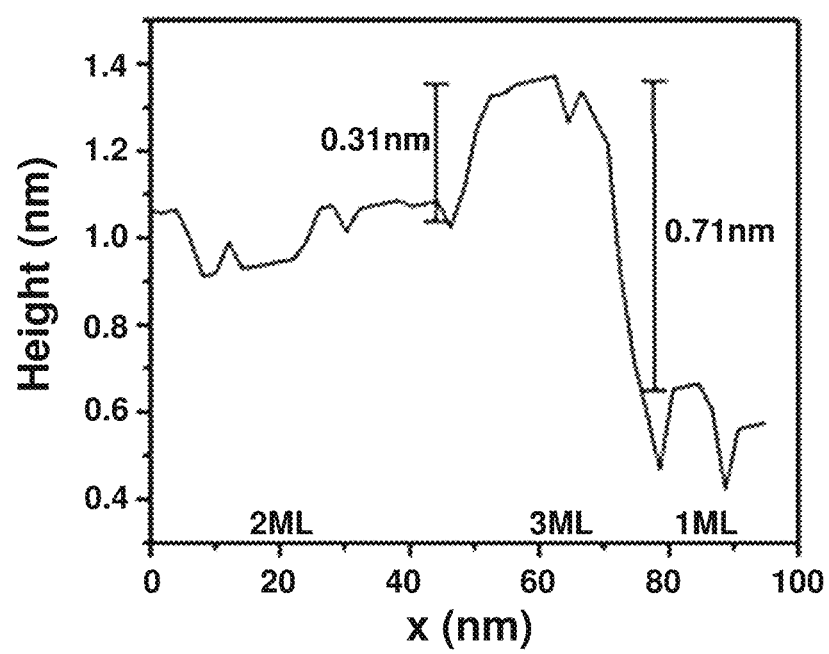
Figure 10D:
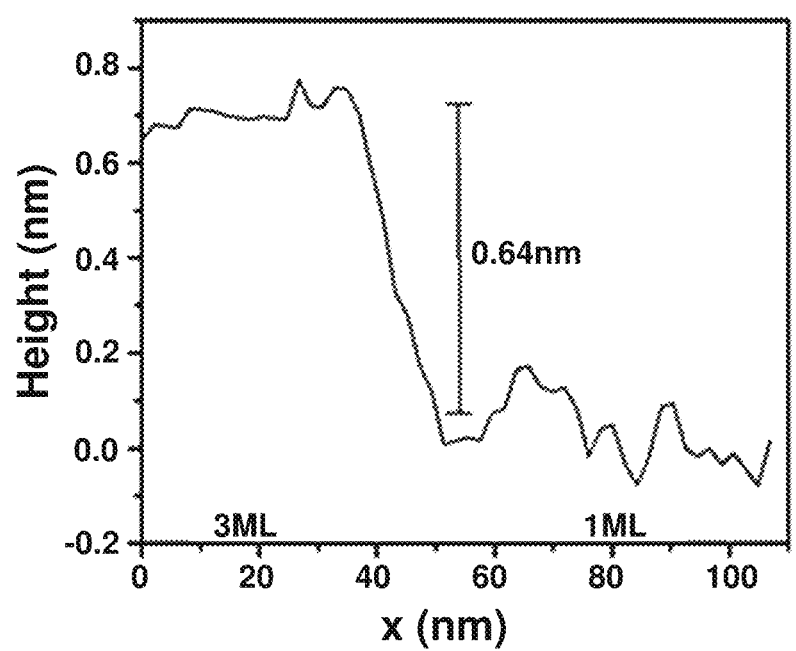
Figure 10E:
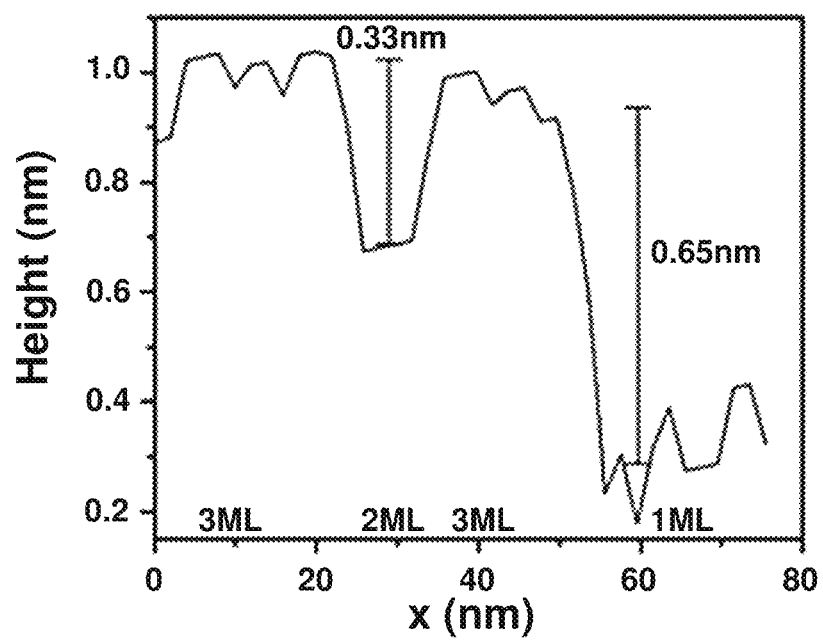
Figure 10F:
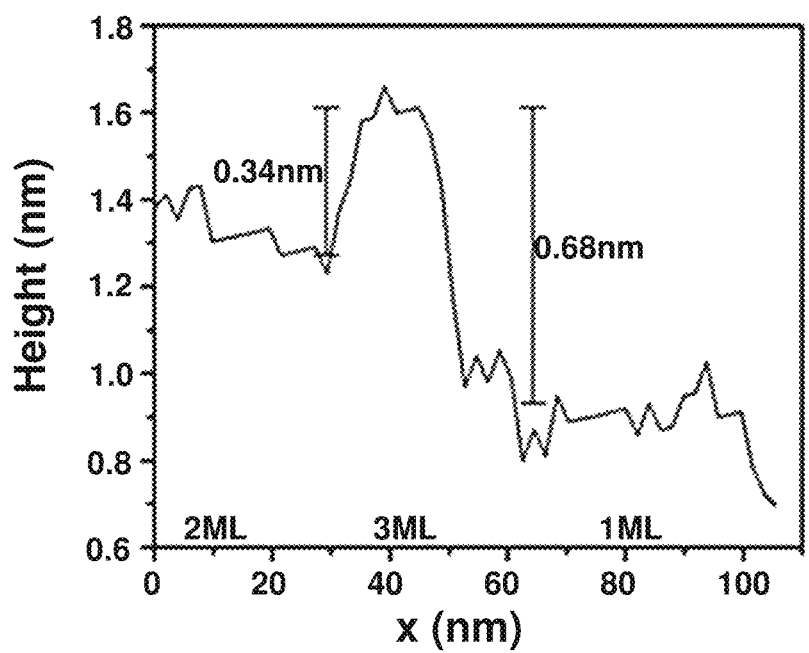

AFM height data taken from a sample with mono-, bi-, and tri-layer thick hBN is shown in FIGS. 9 through 10F. Line scans across these steps show mono- to tri-layer step heights ranging from 0.64 nm to 0.71 nm, and bi to tri-layer step heights from 0.31 nm to 0.34 nm. These values are consistent with vdW-separation between the third and the second hBN layer, as well as between the second and the first hBN layer.

There are general thermodynamic arguments in favor of ring formation and of molecular hydrogen in the deposition of TEB and ammonia on Cu or hBN/Cu. Using standard dissociation energy of various bonds at room temperature, the propensity of a system consisting of ammonia and TEB radicals to form B—N bonds was assessed. The bond energies of various bonds that can form in this system are as follows:

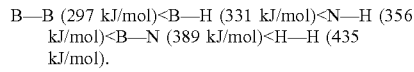

B—B (297 kJ/mol)<B—H (331 kJ/mol)<N—H (356 kJ/mol)<B—N (389 kJ/mol)<H—H (435 kJ/mol).

This sequence of inequalities shows a strong thermodynamic propensity for the formation of $H_2$ molecules (which diffuse away from the system) and of BN bonds. As seen above, the B—N bonds are favored over B—B, B—H, and N—H bonds—all of which have lower dissociation energies, i.e., are weaker than B—N. In other words, based on these bond dissociation energies, the system would prefer to form the bonds that are harder to dissociate, i.e., the B—N and $H_2$ bonds.

In order to verify this prediction obtained from comparing standard bond strengths corresponding to bonding in simple molecules, orbital-based density functional theory calculations with the ADF package were performed. Structures with increasing number of BN bonds were chosen. The rationale for choosing these structures with increasing number of BN units is to follow the stability (as described by the total energy) as a function of the size of 2-D BN "cluster" or fragment. Accordingly, the $H_2N$—BN complexes could polymerize to create $H_2N$—BH—NH—BH and then subsequently rings ($H_6N_3B_3$) and fused rings ($H_8N_5B_5$) on the surface 25 of the substrate 30.

These calculations show that the thermodynamic propensity for forming BN bonds manifests itself in a marked decrease of the total energy of these structures (or fragments) with the number of B—N bonds in the fragment.

Calculations with the same number of atoms but different bonding configurations between them were completed to verify that BN bonds are favored to form in a cluster with prescribed atomic composition.

DFT Calculations. Plane-wave based package VASP was used to perform DFT calculations in the framework of the generalized gradient approximation with the Perdew-Burke-Ernzerhof function. The interactions between hBN sheet(s) and a Cu(111) substrate are weak were modeled using the DFT-D2 method of Grimme. There were two types of DFT results pursued: one is the calculation of adsorption energies on hBN/Cu and hBN(0001) and the other deals with calculating the variations of electronic density at the hBN—Cu and hBN—hBN/Cu interfaces in order to assess the origin of the AFM moiré patterns observed experimentally. For the calculation of adsorption energies, computational cells were lattice matched to hBN and contain a three layer thick 4×4 Cu(111) slab with and without an hBN monolayer on it with an 18 Å vacuum spacing. The hBN sheet in the computational supercell was registered with the Cu(111) substrate with the N atom atop a top layer Cu atom and the B atom above a hollow site. Keeping fixed the bottom layer of Cu, the geometries were relaxed via conjugate-gradient in the presence of dipole corrections using a plane-wave cutoff of 500 eV, a Monkhorst-Pack k-point grid of 3×3×1, and a force tolerance criterion of 0.03 eV/A. Spin-independent DFT calculations (geometry relaxations) for ammonia were carried out and for the two reaction intermediates associated with the deposition of $NH_3$ on the surface 25, that is, NH and $NH_2$. These intermediates on hBN/Cu(111) and hBN(0001) were investigated and are relevant for understanding the growth of the second and higher layers of hBN, respectively. The reactivity of surfaces was assessed through the adsorption of these reaction intermediates.

In order to understand the AFM response, calculations of interfacial electron transfer, $\Delta\rho$, at the hBN—Cu interface were performed, and also at hBN—hBN/Cu interface (i.e., between the first two hBN layers). For the hBN—Cu interface, this is defined as the difference between the electron density of the hBN/Cu system and that of separate hBN and separate Cu at the same physical locations as they occupy in hBN/Cu, $\Delta\rho hBN/Cu = \rho hBN/Cu - \rho hBN - \rho Cu$. Similarly, for the hBN—hBN/Cu interface, the transfer is defined as $\Delta\rho hBN^2/hBN^1/Cu = \rho hBN^2/hBN^1/Cu - \rho hBN^2 - \rho hBN^1/Cu$, where the labels 1 and 2 are given to the hBN layer in contact with the copper, and farther from it, respectively. These differences effectively describe the redistribution of charge due to the creation of the interface and represent the starting point for studying effects where interfacial charge dipoles are important.

Reaxff Molecular Dynamics Simulations. All molecular dynamics simulations were performed using the LAMMPS software, while ReaxFF has been employed to describe the interactions between B, N, and H atoms; the ReaxFF parameters were optimized against density functional theory calculations for ammonia borane. The computational supercell comprise of 20×20 unit cells of hBN (0001); adsorbed B adatoms or $NH_2$/NH radicals were placed on 25% of the surface unit cells, chosen randomly. Note that B adatoms were placed only on N-sites, while the $NH_2$/NH radicals were placed on the B-sites of the hBN surface (not on B-adatoms). Periodic boundary conditions were employed in the plane of the hBN(0001) surface, while a reflective wall was employed 10 Å above the hBN sheet. The system containing the hBN sheet and adatoms/radicals was first thermalized at 27° C. for 1 ns using canonical (NVT) MD simulations with a time step of 0.05 fs; constant temperature conditions were maintained using a Nose-Hoover thermostat. Thereafter, the temperature was ramped from 27° C. to the desired value over 0.1 ns and held at the final temperature (900° C. or 1200° C.) for 2 ns. During the MD simulations, the atoms belonging to the hBN surface were kept fixed, while the temporal evolutions of the B adatoms and $NH_2$/NH radicals were monitored to identify the processes underlying formation of BN rings.

According to embodiments herein, a novel procedure for growing $sp^2$ BN layers 35, 40 on a substrate 30 such as Cu(111) based on using independent precursors 20, 21 for B and N atoms goes beyond the usual limit of single monolayer, which is encountered when using a single, equiatomic precursor for B and N. Embodiments include a mechanism that enables the multilayer growth to rely on the formation of active pyrolysis products of the TEB precursor (e.g., first precursor 20), which strongly adsorb $NH_x$ radicals to facilitate the formation of BN bonds at the surface 25 of the substrate 30. Of key relevance is the excellent alignment of the $sp^2$ BN layers that emerges from this technique; the temperature is sufficiently high that $sp^2$ BN domains with high misorientation angles are unlikely, and in fact we never observe misorientations larger than 1.5°. A suite of characterization experiments enable assessment of the quality and composition of the films. AFM in air enabled observation of moiré superstructure of the first $sp^2$ BN layer and a modulated interface dipole layer formed between $sp^2$ BN and Cu. These findings have improved the understanding of the mechanisms involved in growth of $sp^2$ BN and may help generate new growth methods for applications in which control over the number of layers and their alignment is crucial (such as tunneling barriers, ultrathin capacitors, and graphene-based devices).

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:

1. A method of forming a $sp^2$ nitride (BN) layer on a surface of a substrate, the method consisting of:
providing a first precursor at the surface of the substrate by a first injector, the first precursor being a source of boron;
providing a second precursor at the surface of the substrate by a second injector, the second precursor being a source of nitrogen;
isolatedly introducing the first and second precursors on the surface of the substrate such that the first and second precursors do not interact with each other until at the surface of the substrate,
wherein the first precursor and second precursor are simultaneously present at the surface of the substrate, wherein a ratio of the second precursor to the first precursor ranges from 450 to 4800;
heating the substrate to a temperature greater than a pyrolysis point for either of the first and second precursors;
pyrolyzing the first precursor at the surface of the substrate;
activating the second precursor at the surface of the substrate with products of the pyrolyzed first precursor; and
adsorbing the pyrolyzed first precursor and the activated second precursor onto the surface of the substrate.

2. The method of claim 1, wherein the adsorbed first and second precursors undergo dehydrogenation, polymerization, and then crystallization to form a first $sp^2$ BN layer over the substrate.

3. The method of claim 2, further consisting of continued adsorbing the pyrolyzed first precursor and the activated second precursor onto the $sp^2$ BN layer to form a plurality of clusters of first and second precursors that undergo further dehydrogenation, polymerization, and crystallization to form an additional $sp^2$ BN layer over the $sp^2$ BN layer.

4. The method of claim 3, wherein crystalline structures of the second $sp^2$ BN layer are aligned with crystalline structures of the first $sp^2$ BN layer.

5. The method of claim 2, wherein the first $sp^2$ BN layer comprises a moiré superstructure.

6. The method of claim 1, wherein the substrate consists of any of copper, nickel, iridium, platinum, gold, sapphire, and silicon carbide.

7. The method of claim 1, wherein the substrate has a temperature of less than 1000° C.

8. The method of claim 1, wherein the substrate is electrically inactive.

9. The method of claim 1, wherein the substrate comprises any of an insulator and a semiconductor.

10. A method consisting of:
applying at least a first and second precursor compound simultaneously on a substrate, the first precursor being applied by a first injector, and the second precursor being applied by a second injector, wherein the first precursor and second precursor are simultaneously present at the surface of the substrate, wherein a ratio of the second precursor to the first precursor ranges from 450 to 4800;
isolatedly introducing the first and second precursors on the surface of the substrate such that the first and second precursors do not interact with each other until at the surface of the substrate;
heating the substrate to a temperature greater than a pyrolysis point for either of the first and second precursor compounds;

pyrolyzing the first precursor compound;

activating the second precursor compound; and epitaxially growing a plurality of insulator layers from the pyrolyzed first precursor compound and the activated second precursor compound, wherein the first precursor compound comprises a boron-based material, wherein the second precursor compound comprises a nitrogen-based material, and wherein the plurality of insulator layers comprises $sp^2$ boron nitride (BN) layers.

11. The method of claim 10, consisting of adsorbing the pyrolyzed first precursor compound and the activated second precursor compound onto a surface of the substrate prior to epitaxially growing the plurality of insulator layers.

12. The method of claim 11, wherein the plurality of insulator layers are grown by dehydrogenation, polymerization, and crystallization of an initial adsorbed pyrolyzed first precursor compound and activated second precursor compound followed by dehydrogenation, polymerization, and crystallization of a subsequent adsorbed pyrolyzed first precursor compound and activated second precursor compound until a predetermined number of insulator layers are epitaxially grown.

13. The method of claim 11, wherein growth rates of the plurality of insulator layers are different from one another, and wherein the plurality of insulator layers are epitaxially aligned with one another.

14. A method consisting of:

applying a boron-based precursor compound and nitrogen-based precursor compound independently on a metallic substrate, wherein the boron-based precursor and nitrogen-based precursor are simultaneously present at the surface of the substrate, wherein a ratio of the nitrogen-based precursor to the boron-based precursor ranges from 450 to 4800;

isolatedly introducing the nitrogen-based and boron-based precursors on the surface of the substrate such that the nitrogen-based and boron-based precursors do not interact with each other until at the surface of the substrate;

heating the substrate to at least a threshold temperature causing the boron-based precursor compound to pyrolyze thereby causing the nitrogen-based precursor compound to activate; and growing a plurality of $sp^2$ boron nitride (BN) layers from the pyrolyzed boron-based precursor compound and the activated nitrogen-based precursor compound.

15. The method of claim 14, further consisting of passivating the metallic substrate with at least one $sp^2$ BN monolayer.

16. The method of claim 14, further consisting of growing the plurality of $sp^2$ BN layers through a layer-by-layer process by repeating the applying and heating processes upon completion of each $sp^2$ BN layer.

* * * * *